US008988576B2

(12) United States Patent
Itou

(10) Patent No.: US 8,988,576 B2
(45) Date of Patent: Mar. 24, 2015

(54) SOLID-STATE IMAGING DEVICE AND DIGITAL CAMERA

(71) Applicant: FUJIFILM Corporation, Tokyo (JP)

(72) Inventor: Ryousuke Itou, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/191,877

(22) Filed: Feb. 27, 2014

(65) Prior Publication Data

US 2014/0176771 A1  Jun. 26, 2014

Related U.S. Application Data

(63) Continuation of application No. PCT/JP2012/070733, filed on Aug. 15, 2012.

(30) Foreign Application Priority Data

Aug. 30, 2011 (JP) ................................. 2011-187255

(51) Int. Cl.
*H04N 5/335* (2011.01)
*H04N 5/235* (2006.01)
(Continued)

(52) U.S. Cl.
CPC ........... *H04N 5/374* (2013.01); *H04N 5/23212* (2013.01); *H01L 27/14601* (2013.01); *H01L 27/14627* (2013.01); *H01L 27/14643* (2013.01); *H04N 5/3696* (2013.01); *G03B 13/36* (2013.01)
USPC ....................... 348/308; 348/222.1; 250/208.1

(58) Field of Classification Search
CPC ........................... H01L 27/14601; H04N 5/374
USPC .................... 348/240.99, 308, 345, 362–363, 348/372–376
See application file for complete search history.

(56) References Cited

U.S. PATENT DOCUMENTS 6,829,008 B1  12/2004  Kondo et al.
8,520,132 B2 *  8/2013  Amano .......................... 348/349
(Continued)

FOREIGN PATENT DOCUMENTS

JP  2000-156823 A  6/2000
JP  2006-105771 A  4/2006
(Continued)

OTHER PUBLICATIONS

International Search Report, issued in PCT/JP2012/070733, dated, Sep. 25, 2012.
(Continued)

*Primary Examiner* — Trung Diep
(74) *Attorney, Agent, or Firm* — Birch, Stewart, Kolasch & Birch, LLP

(57) ABSTRACT

A solid-state imaging device comprises first pixels and second pixels. The first pixel has a first PD and a first photoelectric conversion film. The second pixel has a second PD and a second photoelectric conversion film. The first PD and the second PD are formed in a surface layer of a semiconductor substrate. The first photoelectric conversion film is formed over the first PD, in a position shifted in a rightward direction relative to the center of the first PD. The second photoelectric conversion film is formed over the second PD, in a position shifted in a leftward direction relative to the center of the second PD. The first photoelectric conversion film photoelectrically converts incident light incident on a right area of the first PD. The second photoelectric conversion film photoelectrically converts incident light incident on a left area of the second PD.

11 Claims, 22 Drawing Sheets

(51) Int. Cl.
*H01L 27/00* (2006.01)
*H04N 5/374* (2011.01)
*H04N 5/232* (2006.01)
*H01L 27/146* (2006.01)
*H04N 5/369* (2011.01)
*G03B 13/36* (2006.01)

(56) References Cited

U.S. PATENT DOCUMENTS

2010/0188532 A1* 7/2010 Kusaka et al. ........... 348/240.99
2011/0109776 A1 5/2011 Kawai
2012/0026372 A1* 2/2012 Noguchi et al. ............. 348/302

FOREIGN PATENT DOCUMENTS

| JP | 2007-317951 A | 12/2007 |
|---|---|---|
| JP | 2009-158800 A | 7/2009 |
| JP | 2010-93619 A | 4/2010 |
| JP | 2011-103335 A | 5/2011 |

OTHER PUBLICATIONS

Written Opinion of the International Searching Authority, issued in PCT/JP2012/070733, dated, Sep. 25, 2012.

\* cited by examiner

SOLID-STATE IMAGING DEVICE AND DIGITAL CAMERA

CROSS REFERENCE TO RELATED APPLICATIONS

This application is a Bypass Continuation of PCT International Application No. PCT/JP2012/070733 filed on Aug. 15, 2012, which claims priority under 35 U.S.C. §119(a) to Patent Application No. 2011-187255 filed in Japan on Aug. 30, 2011, all of which are hereby expressly incorporated by reference into the present application.

BACKGROUND OF THE INVENTION

1. Field of the Invention

The present invention relates to a solid-state imaging device capable of focus detection of a phase detection method and imaging a parallax image for stereoscopic viewing and a digital camera comprising the solid-state imaging device.

2. Description Related to the Prior Art

Digital cameras comprising a taking lens and a CCD-type or CMOS-type solid-state imaging device are widely used. It is common that such digital cameras comprise an autofocus (hereinafter referred to as the AF) function to automatically adjust the focus of the taking lens.

A so-called phase-detection AF function is known (see Japanese Patent Laid-Open Publication No. 2006-105771, U.S. Pat. No. 6,829,008 (corresponding to Japanese Patent Laid-Open Publication No. 2000-156823), and Japanese Patent Laid-Open Publication No. 2010-093619). The phase-detection AF function automatically adjusts the focus of the taking lens based on the focus detection of a phase detection method. The phase-detection AF function is achieved by providing first phase difference pixels (hereinafter simply referred to as the first pixels) and second phase difference pixels (hereinafter simply referred to as the second pixels), in addition to normal pixels for imaging a normal image (two-dimensional still image).

The normal pixel has a normal opening section that is coincident with the center position of the light-receiving surface of a photodiode. The normal pixel receives light incident on the photodiode through the normal opening section. The first pixel has a first off-center opening section that is shifted in a first direction relative to the center position of the light-receiving surface of the photodiode. The first pixel receives light incident on the photodiode through the first off-center opening section. The second pixel has a second off-center opening section that is shifted in a second direction relative to the center position of the light-receiving surface of the photodiode. The second direction is opposite to the first direction. The second pixel receives light incident on the photodiode through the second off-center opening section.

The normal opening section, the first off-center opening section, and the second off-center opening section are formed through a light shield film. The light shield film covers over a semiconductor substrate in which the photodiodes are formed. The sizes of the first and the second off-center opening sections are smaller than that of the normal opening section.

The first pixel is highly sensitive to light incident from a direction of the shift of the first off-center opening section from the center position of the light-receiving surface of the photodiode. The same holds true for the second pixel. For example, the first pixel is highly sensitive to the incident light from upper right. The second pixel is highly sensitive to the incident light from upper left.

The image obtained from the first pixels and the image obtained from the second pixels shift from each other in a right-left direction in accordance with a focal state of the taking lens. An amount of shift between the two images corresponds to an amount of shift of the focus of the taking lens. The two images coincide and the amount of shift is zero when the taking lens is in focus. The amount of shift between the two images increases as the amount of shift in focus of the taking lens increases. Hence, a focus adjustment amount of the taking lens is determined by detecting the directions of the shifts of the respective images obtained from the first and second pixels and the amount of shift between the images.

During framing of a subject, the digital camera comprising the phase-detection AF function performs the AF control based on pixel signals from the first and the second pixels. In capturing a normal image, the digital camera uses all of the normal pixels, the first pixels, and the second pixels to produce image data.

In the solid-state imaging device disclosed in the above-described documents, a part of the photodiode of the first pixel is covered by the light shield film because the first off-center opening section of the first pixel is shifted from the center position of the light-receiving surface of the photodiode. Hence, the light traveling toward the area covered with the light shield film is blocked by the light shield film. The same holds true for the second pixel. For this reason, the amount of light incident on each of the photodiodes of the first and the second pixels is less than that incident on the photodiode of the normal pixel, and the sensitivity of each of the first and second pixels is lower than that of the normal pixel.

In the solid-state imaging device disclosed in the above-described documents, the direction of the light incident on the first pixel is opposite to the direction of the light incident on the second pixel. Hence, in capturing a normal image, it is necessary to perform so-called pixel addition in which pixel signals of the adjacent first and second pixels are added. In this case, a pixel signal is composed of signals from a pair of first and second pixels, so that resolution of the normal image decreases.

SUMMARY OF THE INVENTION

An object of the present invention is to provide a solid-state imaging device and a digital camera capable of improving sensitivities of first and second pixels and resolution of a captured image.

In order to achieve the above objects, the solid-state imaging device of the present invention comprises a plurality of first pixels and a plurality of second pixels. The first pixel has a first photoelectric converter and a first photoelectric conversion film. The first photoelectric converter and the first photoelectric conversion film photoelectrically convert incident light. The first photoelectric conversion film is shifted in a first direction relative to the first photoelectric converter. The second pixel has a second photoelectric converter and a second photoelectric conversion film. The second photoelectric converter and the second photoelectric conversion film photoelectrically convert incident light. The second photoelectric conversion film is shifted in a second direction relative to the second photoelectric converter. The second direction is opposite to the first direction. The first photoelectric conversion film partially covers an incident side of the first photoelectric converter. The second photoelectric conversion film partially covers an incident side of the second photoelectric converter. The first photoelectric converter is located at the center of the first pixel. The second photoelectric converter is located at the center of the second pixel.

It is preferable that the solid-state imaging device comprises a first adder circuit and a second adder circuit. The first adder circuit adds a signal of the photoelectric converter and a signal of the photoelectric conversion film in each of the first and the second pixels. The second adder circuit adds the signal of the first photoelectric converter and the signal of the second photoelectric conversion film of the two adjacent first and second pixels. The second adder circuit adds the signal of the second photoelectric converter and the signal of the first photoelectric conversion film of the two adjacent first and second pixels.

It is preferable that each of the first and the second photoelectric converters is a photodiode formed in a surface layer of a semiconductor substrate. The first photoelectric converter has a portion, not covered by the first photoelectric conversion film, as a light-receiving area. The second photoelectric converter has a portion, not covered by the second photoelectric conversion film, as a light-receiving area. Each of the first and the second photoelectric converters may be a photoelectric conversion film formed over a semiconductor substrate. Also in this case, the first photoelectric converter has a portion, not covered by the first photoelectric conversion film, as a light-receiving area. The second photoelectric converter has a portion, not covered by the second photoelectric conversion film, as a light-receiving area.

It is preferable that a light-transmissive insulation film is formed over the semiconductor substrate. The first and the second photoelectric conversion films are formed over the insulation film. It is preferable that micro asperities are formed on a surface of the insulation film located above the light-receiving area.

It is preferable that each of the first and the second pixels comprises a microlens and an inner lens located on an inner side of the microlens. An optical axis of the microlens is coincident with a center of the corresponding pixel. An apex of the inner lens is coincident with a center of the corresponding light-receiving area.

It is preferable that a reflection wall is formed on a side of each of the first and the second photoelectric conversion films. The reflection wall is made from a material with a high refractive index.

It is preferable that the first and the second pixels have color filters. The thickness of a portion of the color filter located above the light-receiving area may differ from the thickness of a portion of the color filter located above the first photoelectric conversion film and the thickness of a portion of the color filter located above the second photoelectric conversion film. An area of the light-receiving area may differ from an area of the first photoelectric conversion film and an area of the second photoelectric conversion film.

A digital camera of the present invention comprises a taking lens for forming an image of a subject and a solid-state imaging device for capturing the image. The solid-state imaging device comprises a plurality of first pixels and a plurality of second pixels. The first pixel has a first photoelectric converter and a first photoelectric conversion film. The first photoelectric converter and the first photoelectric conversion film photoelectrically convert incident light. The first photoelectric conversion film is shifted in a first direction relative to the first photoelectric converter. The second pixel has a second photoelectric converter and a second photoelectric conversion film. The second photoelectric converter and the second photoelectric conversion film photoelectrically convert incident light. The second photoelectric conversion film is shifted in a second direction relative to the second photoelectric converter. The second direction is opposite to the first direction. The first photoelectric conversion film partially covers an incident side of the first photoelectric converter and the second photoelectric conversion film partially covers an incident side of the second photoelectric converter. The first photoelectric converter is located at the center of the first pixel. The second photoelectric converter is located at the center of the second pixel.

According to the present invention, each of the first and the second pixel comprises the photoelectric conversion film in addition to the photoelectric converter. The positions of the photoelectric conversion film and the photoelectric converter are reversed between the first and the second pixels. Each of the photoelectric converter and the photoelectric conversion film has a photoelectric conversion function. Hence, the photoelectric conversion is performed in large areas formed by the first and the second pixels. Thereby the sensitivities of the first and the second pixels are improved.

In detecting the focus and in capturing a stereoscopic image, the signal of the photoelectric converter and the signal of the photoelectric conversion film of the first and the second pixels are added. In capturing the normal image, the signal of the photoelectric converter is added to the signal of the photoelectric conversion film within a pixel. Hence the resolution of the captured image improves as compared with the conventional case where the image signal of one pixel is generated from each of the first and the second pixels.

BRIEF DESCRIPTION OF THE DRAWINGS

The above and other objects and advantages of the present invention will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS

First Embodiment

Figure 1:
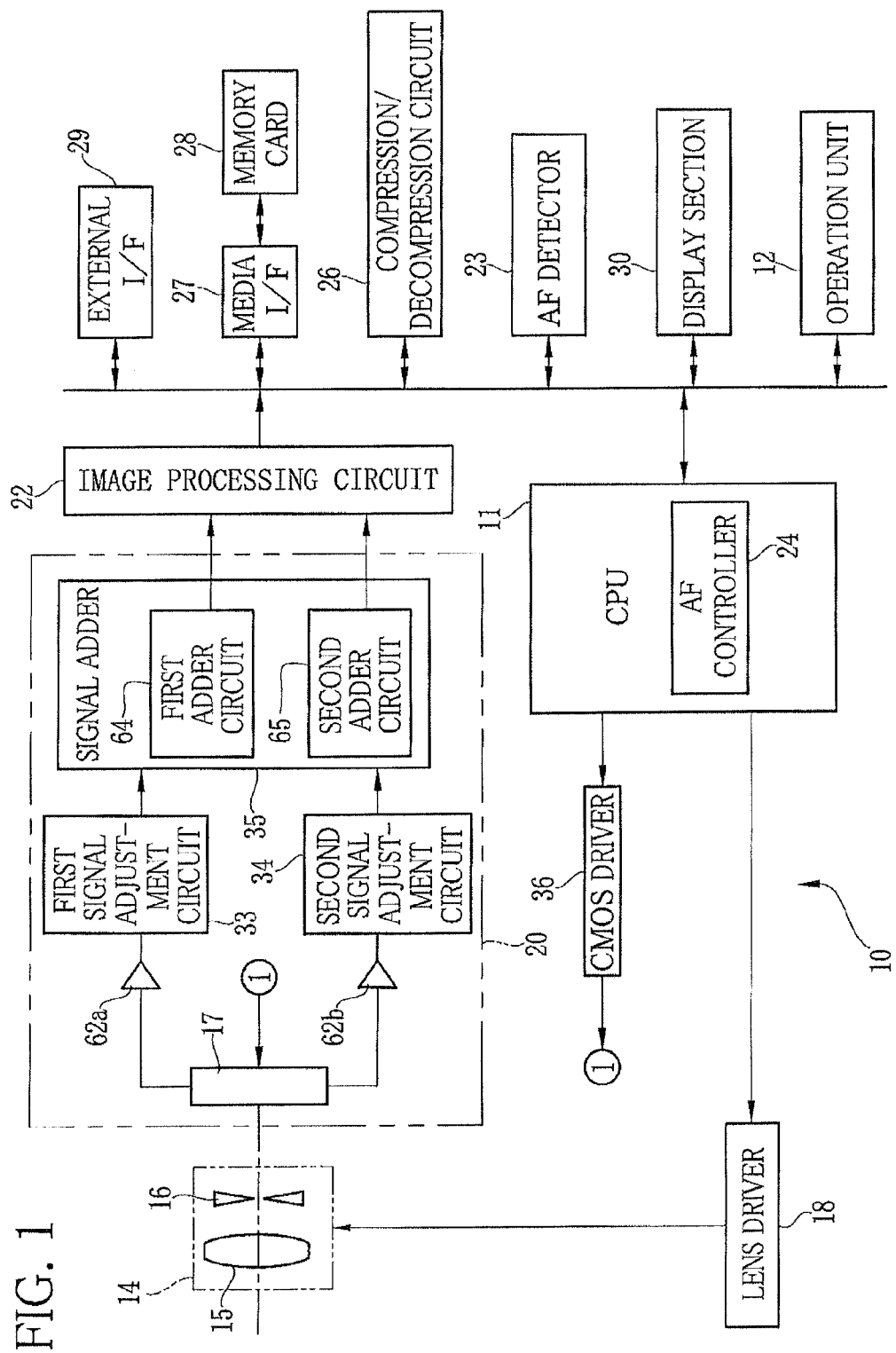
FIG. 1 is a block diagram illustrating an electric configuration of a digital camera.

In FIG. 1, a digital camera 10 has a CPU 11. The CPU 11 reads out various programs and data from a memory (not shown) and sequentially executes them based on a control signal from an operation unit 12. Thereby the CPU 11 controls each section of the digital camera 10. The operation unit 12 includes a shutter release button and various operation buttons.

The digital camera 10 functions as a monocular 3D camera capable of producing a parallax image for stereoscopic viewing. The digital camera 10 has a special imaging mode and a normal imaging mode. In the special imaging mode, the digital camera 10 produces a parallax image. In the normal imaging mode, the digital camera 10 produces a normal image (two-dimensional still image) with no disparity. The operation unit 12 is used to switch the imaging mode of the digital camera 10. Note that the digital camera 10 is also capable of capturing moving images.

A lens unit 14 incorporates a well-known focus mechanism (not shown) in addition to a taking lens 15 and a mechanical shutter 16. The CPU 11 controls the mechanical shutter 16 and the focus mechanism through a lens driver 18. The focus mechanism shifts a focus lens (not shown) in a direction of an optical axis to adjust the focus. The focus lens is included in the taking lens 15.

The mechanical shutter 16 has a movable section (not shown). The movable section moves between a closed position and an open position. In the closed position, the movable section prevents light from entering a solid-state imaging device 17 of an imaging section 20. In the open position, the movable section allows light to enter the solid-state imaging device 17. The mechanical shutter 16 shifts the movable section to the open position or the closed position to open or shut a light path from the taking lens 15 to the solid-state imaging device 17. The lens unit 14 includes an aperture stop (not shown) for controlling an amount of light incident on the solid-state imaging device 17.

The imaging section 20 comprises the solid-state imaging device 17. The imaging section 20 converts light from the taking lens 15 into an electric image signal and outputs the electric image signal. The imaging section 20 generates an image signal for producing a normal image and image signals for producing a parallax image and for the phase-detection AF.

An image processing circuit 22 performs various processes such as gradation conversion, white balance correction, and gamma correction on the image signal, which is inputted from the imaging section 20, to produce image data. The image processing circuit 22 produces normal image data in the normal imaging mode. The image processing circuit 22 produces parallax image data in the special imaging mode. The parallax image data is composed of two pieces of viewpoint image data. The image processing circuit 22 produces a pair of focus detection image data in the normal imaging mode and the special imaging mode.

Based on the focus detection image data, an AF detector 23 obtains a focus adjustment amount for focusing the taking lens 15. Based on the focus adjustment amount obtained by the AF detector 23, an AF controller 24 of the CPU 11 moves the focus lens through the lens driver 18. Thus, the focus is adjusted.

A compression/decompression circuit 26 compresses each image data produced in the image processing circuit 22. The compression/decompression circuit 26 decompresses the compressed image data read out from a memory card 28 through a media I/F 27. The media I/F 27 records each image data on the memory card 28 and reads out each image data from the memory card 28.

An external I/F 29 is connected to external devices, such as a printer and a personal computer, to communicate each image data with the external devices. A USB (Universal Serial Bus) or the like is used as the external I/F 29. A display section 30 is a liquid crystal display or the like. The display section 30 displays through images (live view images), reproduced images, or the like. The display section 30 displays a stereoscopic image when a parallax image is captured.

The imaging section 20 has the solid-state imaging device 17, amplifiers 62a and 62b, a first signal adjustment circuit 33, a second signal adjustment circuit 34, and a signal adder circuit 35. These circuits are formed on a semiconductor substrate on which the solid-state imaging device 17 is formed, and constitute the imaging section 20. The solid-state imaging device 17 is a CMOS type image sensor. Under the control of the CPU 11, a CMOS driver 36 drives the solid-state imaging device 17.

Figure 2:
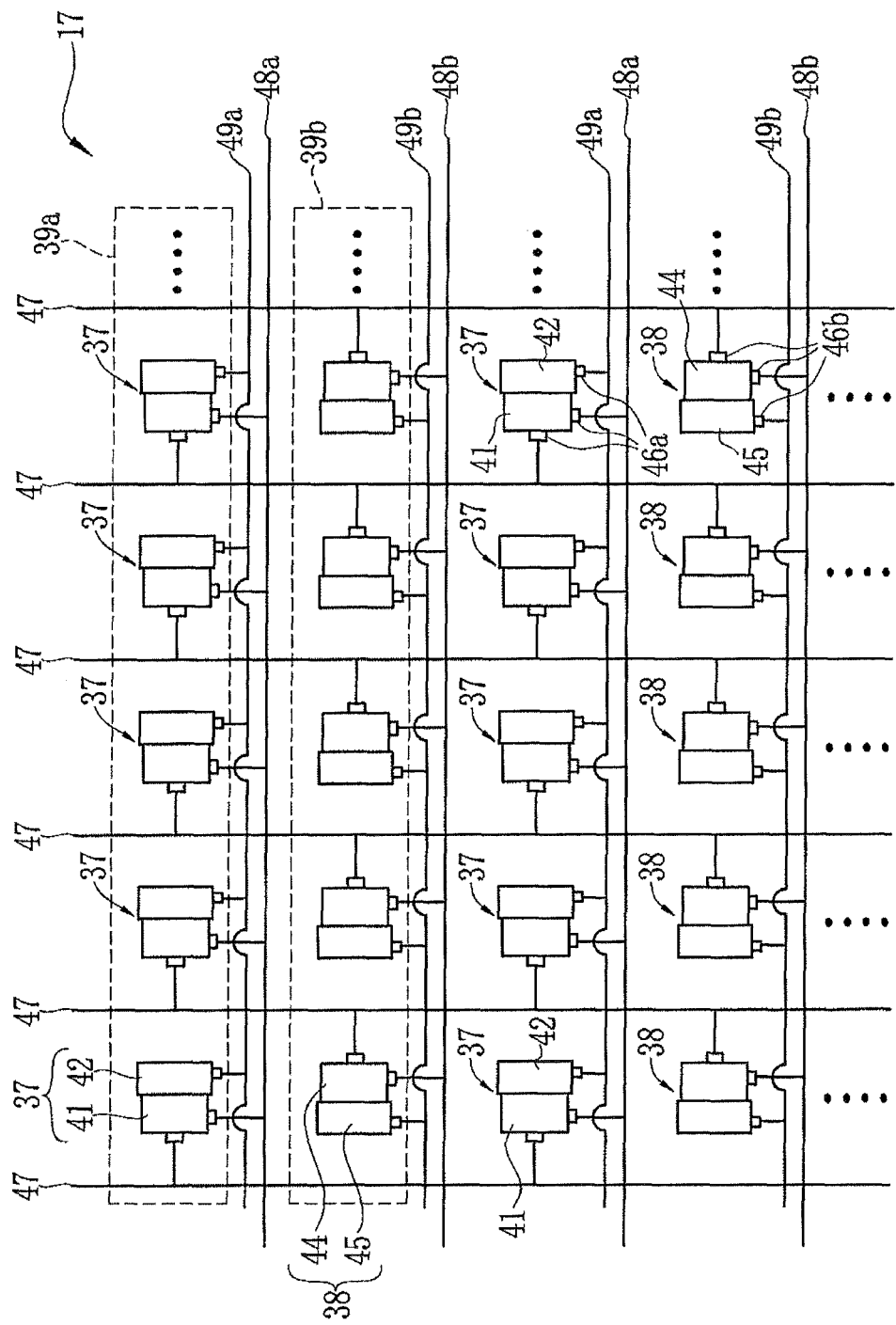
FIG. 2 is a plan view illustrating a configuration of a solid-state imaging device.
Figure 3:
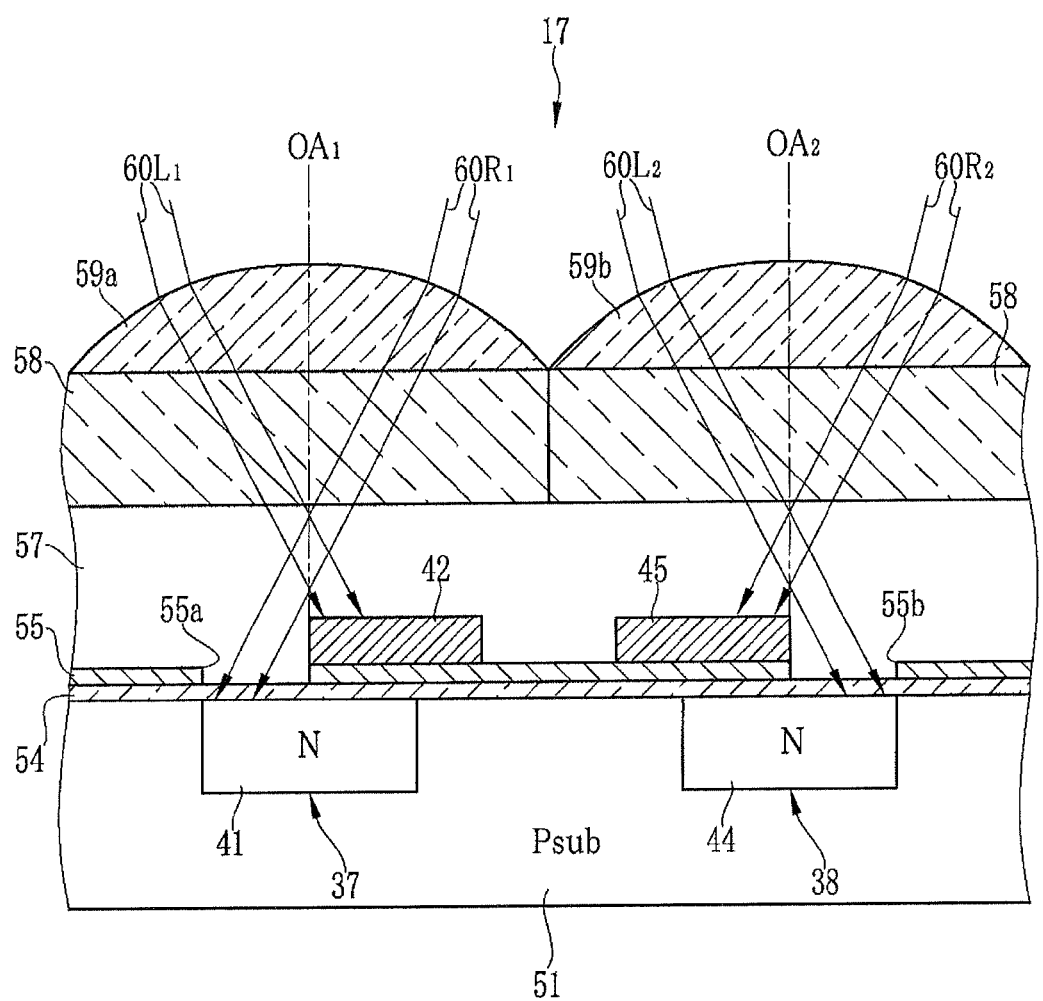
FIG. 3 is a cross-sectional view illustrating a first pixel and a second pixel disposed side by side.

In FIGS. 2 and 3, the solid-state imaging device 17 has first phase difference pixels (hereinafter simply referred to as the first pixels) 37 and second phase difference pixels (hereinafter simply referred to as the second pixels) 38. The first pixels 37 arranged in a horizontal direction constitute a first pixel row 39a. The second pixels 38 arranged in the horizontal direction constitute a second pixel row 39b. The first pixel rows 39a and the second pixels rows 39b are arranged alternately in a perpendicular direction on an imaging surface of the solid-state imaging device 17. The first pixel 37 and the second pixel 38 adjacent to each other in the perpendicular direction are treated as a pair, which will be described below.

The first pixel 37 has a first photodiode (PD) 41 and a first photoelectric conversion film 42. Each of the first PD 41 and the first photoelectric conversion film 42 has a rectangular shape and photoelectrically converts incident light into a signal charge. As shown in FIG. 3, the first photoelectric conversion film 42 is disposed to partly cover the first PD 41. Hence, the first PD 41, being a photoelectric converter, is highly sensitive to light incident from upper right. Conversely, the first photoelectric conversion film 42 is highly sensitive to light incident from upper left.

The second pixel 38 has a second photodiode (PD) 44 and a second photoelectric conversion film 45, in a similar manner. Each of the second PD 44 and the second photoelectric conversion film 45 has a rectangular shape and photoelectrically converts incident light into a signal charge. The second photoelectric conversion film 45 is disposed to partly cover the second PD 44. Hence, the second PD 44, being the photoelectric converter, is highly sensitive to the light incident from the upper left. Conversely, the second photoelectric conversion film 45 is highly sensitive to the light incident from the upper right. The first and the second photoelectric conversion films 42 and 45 are organic photoelectric conversion films or made from amorphous silicon, for example.

The first pixel 37 is provided with a first pixel circuit 46a. The second pixel 38 is provided with a second pixel circuit 46b. The first pixel circuit 46a amplifies the signal charges stored in the respective first PD 41 and the first photoelectric conversion film 42, and outputs them as signal voltages. The second pixel circuit 46b amplifies the signal charges stored in the respective second PD 44 and the second photoelectric conversion film 45, and outputs them as signal voltages.

Each of the first and the second pixel circuits 46a and 46b has a read-out transistor, an amplifying transistor, a switch transistor, a reset transistor, and the like, which are well-known. The read-out transistor reads out the signal charges stored in the PD and the photoelectric conversion film. The amplifying transistor amplifies the signal charges read out by the read-out transistor and outputs them as the signal voltages. The switch transistor controls reading of the signal voltages to a signal line. The reset transistor discharges the signal charges stored in the PD and the photoelectric conversion film.

The solid-state imaging device 17 is provided with drive lines 47, first PD signal lines 48a, second PD signal lines 48b, first-photoelectric-conversion-film signal lines 49a, and second-photoelectric-conversion-film signal lines 49b. The drive lines 47 drive the first and the second pixel circuits 46a and 46b.

The first PD signal lines 48a and the first-photoelectric-conversion-film signal lines 49a extend in the horizontal direction. The first PD signal line 48a and the first-photoelectric-conversion-film signal line 49a are provided for each first pixel row 39a. The second PD signal lines 48b and the second-photoelectric-conversion-film signal lines 49b extend in the horizontal direction. The second PD signal line 48b and the second-photoelectric-conversion-film signal line 49b are provided for each second pixel row 39b.

The first PD signal line 48a reads out a signal voltage corresponding to the signal charge stored in the first PD 41. The second PD signal line 48b reads out a signal voltage corresponding to the signal charge stored in the second PD 44. The first-photoelectric-conversion-film signal line 49a reads out a signal voltage corresponding to the signal charge stored in the first photoelectric conversion film 42. The second-photoelectric-conversion-film signal line 49b reads out a signal voltage corresponding to the signal charge stored in the second photoelectric conversion film 45.

The drive lines 47 extend in the perpendicular direction. The drive lines 47 are provided for respective columns of the first and the second pixels 37 and 38. The CMOS driver 36 is connected to the CPU 11. The CMOS driver 36 drives the first and the second pixel circuits 46a and 46b through the respective drive lines 47.

The signal voltages are read out through the respective first and second PD signal lines 48a and 48b, and then each signal voltage is outputted as an image signal to the first signal adjustment circuit 33 through a well-known output circuit and a well-known amplifier (both not shown). The signal voltages are read out through the respective first and second photo-electric-conversion-film signal lines 49a and 49b and then each signal voltage is outputted as an image signal to the second signal adjustment circuit 34 through a well-known output circuit and a well-known amplifier (both not shown), in a similar manner. Hereinafter, the image signal corresponding to the first PD 41 is referred to as the first $R_P$ image signal. The image signal corresponding to the first photoelectric conversion film 42 is referred to as the first $L_F$ image signal. The image signal corresponding to the second PD 44 is referred to as the second $L_P$ image signal. The image signal corresponding to the second photoelectric conversion film 45 is referred to as the second $R_F$ image signal.

In FIG. 3, N-type layers are formed in a surface layer of a semiconductor substrate (Psub) 51. The semiconductor substrate 51 is formed of P-type silicon. The N type layers constitute the respective first and second PDs 41 and 44. The semiconductor substrate 51 is formed with the above-described first and second pixel circuits 46a and 46b (not shown in FIG. 3).

A transparent insulation film 54 is provided over the semiconductor substrate 51. The insulation film 54 is formed of silicon dioxide ($SiO_2$), for example. A light shield film 55 is provided over the insulation film 54. The light shield film 55 is formed of tungsten, for example. The light shield film 55 has a first off-center opening 55a and a second off-center opening 55b. The first off-center opening 55a is located above the first PD 41. The second off-center opening 55b is located above the second PD 44.

The first off-center opening 55a is formed in a position shifted in a leftward direction relative to the center of the first PD 41. Thereby a light-shielded area (hereinafter simply referred to as the right area), that is, an approximately right half of the first PD 41 is covered by the light shield film 55, while a light-receiving area (hereinafter simply referred to as the left area), that is, an approximately left half of the first PD 41 is exposed. On the other hand, the second off-center opening 55b is formed in a position shifted in a rightward direction relative to the center of the second PD 44. Thereby the left area (the light-shielded area) of the second PD 44 is covered by the light shield film 55 while the right area (the light-receiving area) of the second PD 44 is exposed.

The first photoelectric conversion film 42 and the second photoelectric conversion film 45 are provided over the light shield film 55. The first photoelectric conversion film 42 is disposed to cover the right area of the first PD 41. The second photoelectric conversion film 45 is disposed to cover the left area of the second PD 44.

A light-transmissive planarizing layer 57 is provided to cover the first and the second photoelectric conversion films 42, 45 and the light shield film 55. A top surface of the planarizing layer 57 is planarized. Color filters 58 are provided over the planarizing layer 57. The color filters 58 are provided for the respective first and second pixels 37 and 38. The color filters 58 corresponding to a pair of the adjoining first and second pixels 37 and 38 have the same color.

The first and the second PD signal lines 48a and 48b, the first- and the second-photoelectric-conversion-film signal lines 49a and 49b, and the drive lines 47 (all not shown in FIG. 3) are formed in the planarizing layer 57.

First and second microlenses 59a and 59b are provided over the color filters 58. An optical axis $OA_1$ of the first microlens 59a is located at the center of the first PD 41 (center of the first pixel 37). An optical axis $OA_2$ of the second microlens 59b is located at the center of the second PD 44 (center of the second pixel 38).

The first microlens 59a collects incident light 60R₁, incident on the first microlens 59a from a right oblique direction, onto the left area (the light-receiving area) of the first PD 41. On the other hand, the first microlens 59a collects incident light 60L₁, incident on the first microlens 59a from a left oblique direction, onto the first photoelectric conversion film 42. The incident light 60L₁ is photoelectrically converted by the first photoelectric conversion film 42 and the light shield film 55 is formed immediately below the first photoelectric conversion film 42, so that the incident light 60L₁ does not reach the first PD 41. Hence, the first PD 41 is highly sensitive to the incident light 60R₁. The first photoelectric conversion film 42 is highly sensitive to the incident light 60L₁.

The second microlens 59b collects incident light 60L₂, incident on the second microlens 59b from a left oblique direction, onto the right area (the light-receiving area) of the second PD 44. On the other hand, the second microlens 59b collects incident light 60R₂, incident on the second microlens 59b from a right oblique direction, onto the second photoelectric conversion film 45. The incident light 60R₂ is photoelectrically converted by the second photoelectric conversion film 45 and the light shield film 55 is formed immediately below the second photoelectric conversion film 45, so that the incident light 60R₂ does not reach the second PD 44. Hence, the second PD 44 is highly sensitive to the incident light 60L₂. The second photoelectric conversion film 45 is highly sensitive to the incident light 60R₂.

The first signal adjustment circuit 33 illustrated in FIG. 1 is connected to the solid-state imaging device 17 through the first amplifier 62a. The first signal adjustment circuit 33 multiplies each of the first $R_P$ image signal and the second $L_P$ image signal, inputted from the solid-state imaging device 17 through the first amplifier 62a, by a predetermined coefficient K1.

The second signal adjustment circuit 34 is connected to the solid-state imaging device 17 through the second amplifier 62b, in a similar manner. The second signal adjustment circuit 34 multiplies each of the first $L_F$ image signal and the second $R_F$ image signal, inputted from the solid-state imaging device 17 through the second amplifier 62b, by a predetermined coefficient K2. The coefficients K1 and K2 are set such that the amounts of the image signals are substantially equal to each other in a case where the same amount of light is incident on the first and the second pixels 37 and 38.

The signal adder circuit 35 adds the image signals, inputted from the respective first and second signal adjustment circuits 33 and 34, in a predetermined combination, and outputs a result to the image processing circuit 22. The signal adder circuit 35 has a first adder circuit 64 and a second adder circuit 65.

Figure 4:
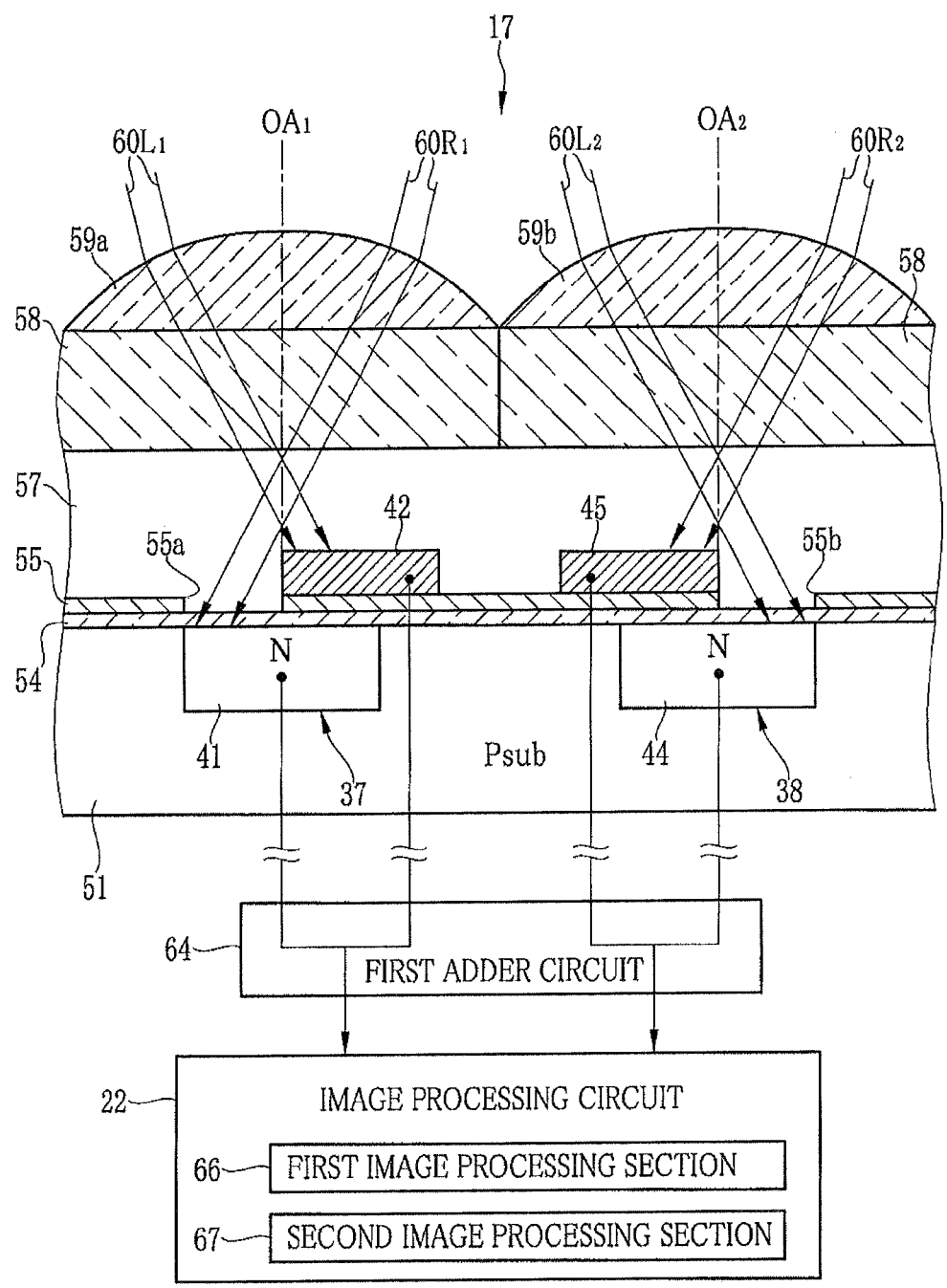
FIG. 4 is an explanatory view illustrating an adding process performed by a first adder circuit.

In FIG. 4, the first adder circuit 64 adds the first $R_P$ image signal and the first $L_F$ image signal, both read out from the first pixel 37 in time-series, on a pixel-by-pixel basis. Thereby a first intrapixel sum signal is generated. The first adder circuit 64 adds the second $L_P$ image signal and the second $R_F$ image signal, both read out from the second pixel 38 in time-series, on a pixel-by-pixel basis. Thereby a second intrapixel sum signal is generated. The first intrapixel sum signal corresponds to a signal of one pixel. The second intrapixel sum signal corresponds to a signal of one pixel. The first adder circuit 64 outputs the first and the second intrapixel sum signals to the image processing circuit 22.

The image processing circuit 22 has a first image processing section 66 and a second image processing section 67. The first image processing section 66 is activated in the normal imaging mode. The first image processing section 66 produces the normal image data based on the first and the second intrapixel sum signals inputted from the first adder circuit 64.

Figure 5:
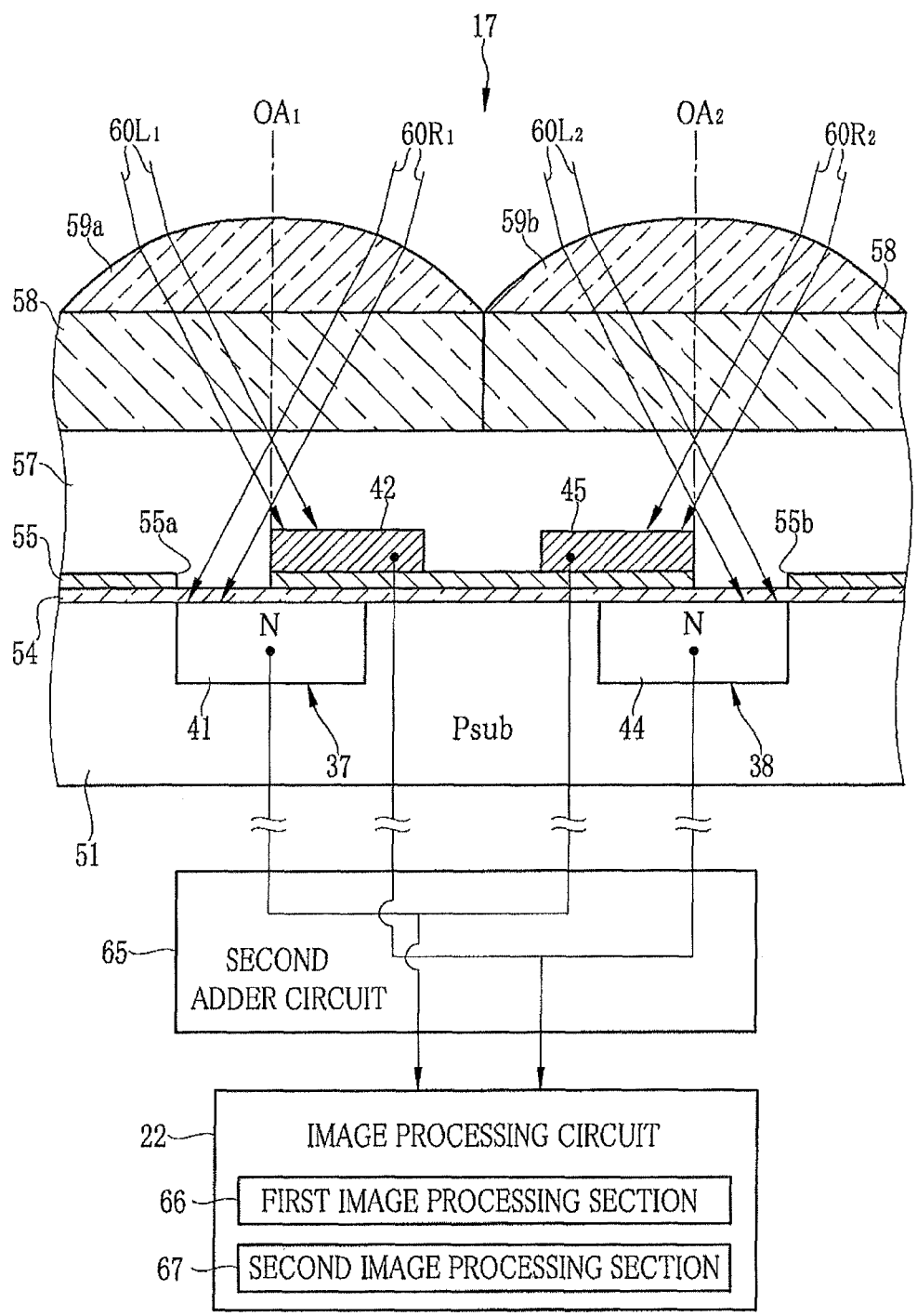
FIG. 5 is an explanatory view illustrating an adding process performed by a second adder circuit.

In FIG. 5, the second adder circuit 65 adds image signals of the pair of the first and the second pixels 37 and 38. To be more specific, the second adder circuit 65 adds the first $R_P$ image signal outputted from the first pixel 37 and the second $R_F$ image signal outputted from the second pixel 38 of the pair of pixels 37 and 38, to generate a first interpixel sum signal. The second adder circuit 65 adds the first $L_F$ image signal outputted from the first pixel 37 and the second $L_P$ image signal outputted from the second pixel 38 of the pair of pixels 37 and 38, to generate a second interpixel sum signal. The first and the second interpixel sum signals are transmitted to the image processing circuit 22.

The second image processing section 67 activates in the special imaging mode. The second image processing section 67 produces R viewpoint image data (first image) and L viewpoint image data (second image). The R viewpoint image data is produced based on the first interpixel sum signal generated from the signals of the pair of the first and the second pixels 37 and 38. The L viewpoint image data is produced based on the second interpixel sum signal generated from the signals of the pair of the first and the second pixels 37 and 38.

Figure 6:
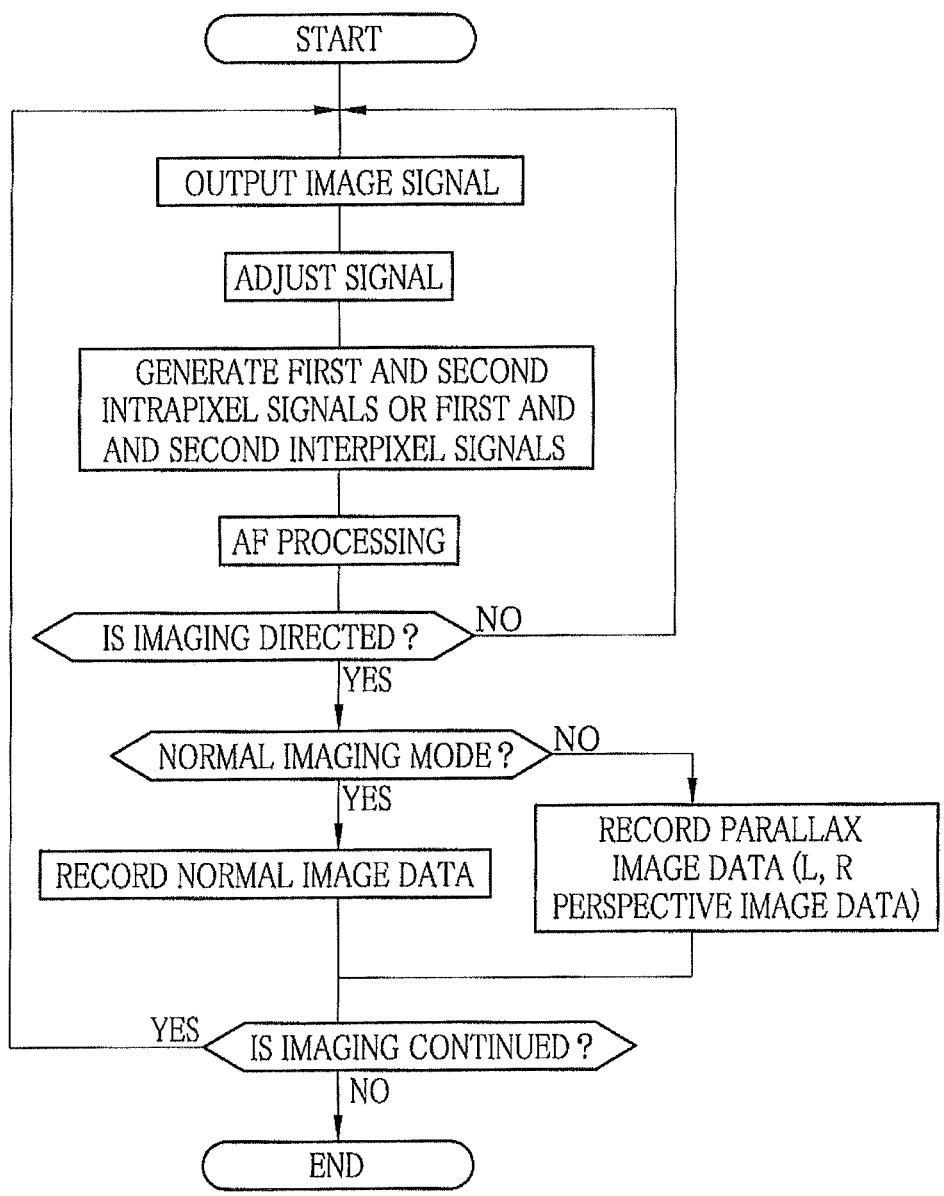
FIG. 6 is a flowchart illustrating steps for image capture using the digital camera.

Next, an operation of the digital camera 10 is described with reference to a flowchart of FIG. 6. When the normal imaging mode or the special imaging mode is chosen through the operation unit 12, the CPU 11 drives the mechanical shutter 16 through the lens driver 18 and drives the solid-state imaging device 17 through the CMOS driver 36.

When the mechanical shutter 16 is opened, light from the subject is incident on the solid-state imaging device 17. At that time, the incident light 60R₁ is incident on the left area (the light-receiving area) of the first PD 41 through the first off-center opening 55a formed through the light shield film 55. The incident light 60L₁ directed toward the right area (the light-shielded area) of the first PD 41 is incident on the first photoelectric conversion film 42. The incident light 60L₂ is incident on the right area (the light-receiving area) of the second PD 44 through the second off-center opening 55b formed through the light shield film 55, in a similar manner. The incident light 60R₂ directed toward the left area (the light-shielded area) of the second PD 44 is incident on the second photoelectric conversion film 45. Thus, the incident light is received by substantially the entire areas of the first and the second pixels 37 and 38.

Each of the first and the second PDs 41 and 44 and the first and the second photoelectric conversion films 42 and 45 in the first and the second pixels 37 and 38 of the solid-state imaging device 17 photoelectrically converts the incident light into a signal charge and stores it. These signal charges are read out as the signal voltages by the respective first and second pixel circuits 46a and 46b, under the control of the CMOS driver 36.

The signal voltage, outputted from the first PD 41, is outputted as the first $R_P$ image signal to the first signal adjustment circuit 33 through the first PD signal line 48a. The signal voltage, outputted from the second PD 44, is outputted as the second $L_P$ image signal to the first signal adjustment circuit 33 through the second PD signal line 48b, in a similar manner. The signal voltage, outputted from the first photoelectric conversion film 42, is outputted as the first $L_F$ image signal to the second signal adjustment circuit 34 through the first-photo-electric-conversion-film signal line 49a. The signal voltage, outputted from the second photoelectric conversion film 45, is outputted as the second $R_F$ image signal to the second signal adjustment circuit 34 through the second-photoelectric-conversion-film signal line 49b, in a similar manner.

The first signal adjustment circuit 33 multiplies each of the first $R_P$ image signal and the second $L_P$ image signal by the predetermined coefficient K1, and then outputs the signals to the signal adder circuit 35. The second signal adjustment circuit 34 multiplies each of the first $L_F$ image signal and the second $R_F$ image signal by the predetermined coefficient K2, and then the signals are outputted to the signal adder circuit 35.

As shown in FIG. 4, the first adder circuit 64 adds the first $R_P$ image signal and the first $L_F$ image signal within each first pixel 37 to generate the first intrapixel sum signal. The first adder circuit 64 adds the second $L_P$ image signal and the second $R_F$ image signal within each second pixel 38 to generate the second intrapixel sum signal. The first and the second intrapixel sum signals are outputted to the image processing circuit 22.

As shown in FIG. 5, the second adder circuit 65 adds the first $R_P$ image signal and the second $R_F$ image signal of the pair of the first and the second pixels 37 and 38 to generate the first interpixel sum signal. The second adder circuit 65 adds the first $L_F$ image signal and the second $L_P$ image signal of the pair of the first and the second pixels 37 and 38 to generate the second interpixel sum signal. The first and the second interpixel sum signals are outputted to the image processing circuit 22.

In a case where the operation mode of the digital camera 10 is in the normal imaging mode, the image processing circuit 22 activates the first image processing section 66. The first image processing section 66 produces the normal image data based on the first and the second intrapixel sum signal inputted from the first adder circuit 64.

In a case where the operation mode of the digital camera 10 is in the special imaging mode, the image processing circuit 22 activates the second image processing section 67. The second image processing section 67 produces the R viewpoint image data and the L viewpoint image data based on the respective first and second interpixel sum signals inputted from the second adder circuit 65.

Note that the above operations are repeated at a predetermined cycle in the normal imaging mode. The normal image data produced by the first image processing section 66 is outputted to the display section 30. In the special imaging mode, the R viewpoint image data and the L viewpoint image data is produced at a predetermined cycle and transmitted to the display section 30. Thus a stereoscopic image is displayed. Note that, if the display section 30 is not intended for displaying a stereoscopic image, the R viewpoint image data is outputted to the display section 30. Thereby the display section 30 displays two-dimensional or three-dimensional through images.

In either of the normal imaging mode and the special imaging mode, the image processing circuit 22 produces R focus detection image data (first image) and L focus detection image data (second image). The R focus detection image data and L focus detection image data is used for the phase-detection AF. The R focus detection image data and the L focus detection image data is produced based on the first and the second interpixel sum signals of the first and the second pixels 37 and 38 located in a part (for example, a center portion) of the imaging area of the solid-state imaging device 17. The subject images in the first and the second images shift in a right-left direction in accordance with a focal state of the taking lens 15. Note that, in the special imaging mode, the R viewpoint image data and the L viewpoint image data obtained from the entire imaging area may be used as the first and the second images. The first and the second images are transmitted to the AF detector 23.

The AF detector 23 analyzes the first and the second images to detect a direction and an amount of a shift between the first and the second images. Thereby a focus adjustment amount (in-focus position) of the focus lens is determined. The focus lens is included in the taking lens 15. Based on the focus adjustment amount, the AF controller 24 moves the focus lens through the lens driver 18. Thus the AF controller 24 performs the AF processing. Note that the phase-detection AF is described in detail in, for example, Japanese Patent No. 2959142 and Japanese Patent Laid-Open Publication No. 2009-128892, so that descriptions thereof are omitted. The AF processing is performed at a predetermined cycle until the operation unit 12 commands imaging.

When a shutter release button of the operation unit 12 is half-pressed in the normal imaging mode, an exposure value is calculated in accordance with luminance of the first and the second images, as is well known. The aperture value and the exposure time (storage time) are determined in accordance with the exposure value. The aperture stop is controlled in accordance with the aperture value.

When the shutter release button is fully pressed to command imaging, all the pixels are reset. The charge stored in each pixel is forcefully discharged. After resetting, the exposure is started. The photoelectric conversion is performed and the charge is stored in each pixel. When the exposure time elapses, the mechanical shutter 16 is closed to end the exposure.

When the exposure is completed, the image signal of one frame is outputted from the solid-state imaging device 17. The image signal is subjected to various processes in the first and the second signal adjustment circuits 33 and 34, the first adder circuit 64, and the image processing circuit 22. Thus the normal image data is produced. The normal image data is compressed in the compression/decompression circuit 26 and then recorded in the memory card 28 through the media I/F 27. Note that the mechanical shutter 16 opens again after the image signal is taken in. Thereby imaging of through images is started.

Each of the first and the second pixels 37 and 38 receives the right obliquely incident light and left obliquely incident light. Hence, the image signal with the sensitivity substantially the same as that of the image signal of the normal pixel is obtained by intrapixel addition. Thus, there is no need to perform the conventional pixel addition to improve the sensitivity and no reduction in resolution.

Figure 7:
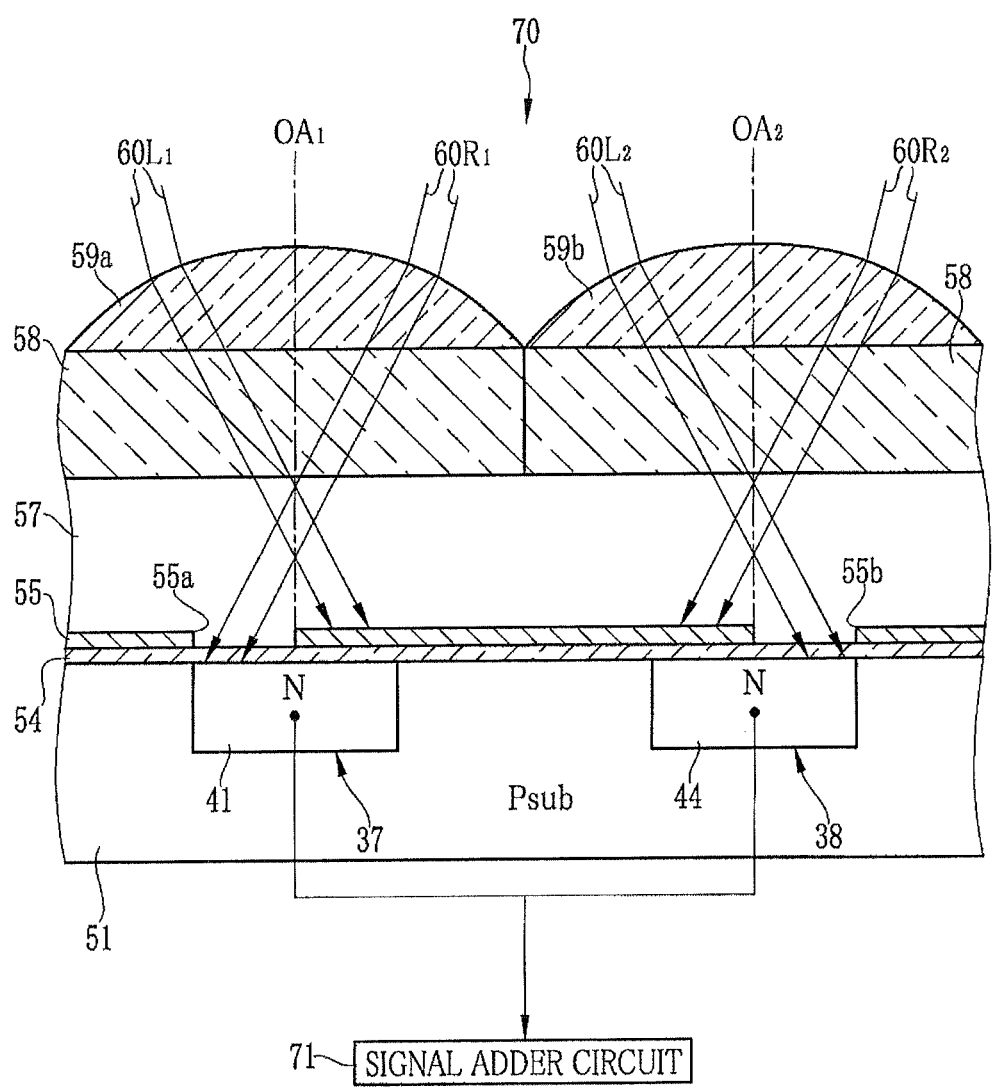
FIG. 7 is a cross-sectional view illustrating a comparative example of the solid-state imaging device.

In a comparative example illustrated in FIG. 7, on the other hand, the right area of the first PD 41 and the left area of the second PD 44 of a solid-state imaging device 70 are shielded from light. The solid-state imaging device 70 is not provided with the first photoelectric conversion film 42 and the second photoelectric conversion film 45 shown in FIGS. 3 to 5. In the comparative example, only approximately half area of the first PD 41 of the first pixel 37 receives the incident light. Only approximately half area of the second PD 44 of the second pixel 38 receives the incident light. For this reason, in producing the normal image data, a signal adder circuit 71 needs to perform addition (pixel addition) of the first $R_P$ image signal of the first pixel 37 and the second $L_P$ image signal of the second pixel 38 to generate the image signal of one pixel. Thereby the resolution of normal image data is reduced to ½.

In the special imaging mode, when the imaging is commanded through the operation unit 12, stereoscopic imaging is performed under the automatic exposure control as described above. After the imaging, the image signal of one frame is obtained from the solid-state imaging device 17. The image signal is subjected to various processes in the first and the second signal adjustment circuits 33 and 34, the second adder circuit 65, and the image processing circuit 22. Thus the R viewpoint image data and the L viewpoint image data is produced. The R viewpoint image data and the L viewpoint image data is subjected to image compression in the compression/decompression circuit 26 and then recorded as parallax image data in an image file in the memory card 28.

The R viewpoint image data and the L viewpoint image data is produced based on the first and the second interpixel sum signals. The second adder circuit 65 performs interpixel addition and thereby generates two pixel signals from two pixels. As a result, the sensitivity improves. After the stereoscopic image is captured, the mechanical shutter 16 opens again. Thereby capturing through images resumes.

Second Embodiment

Figure 8:
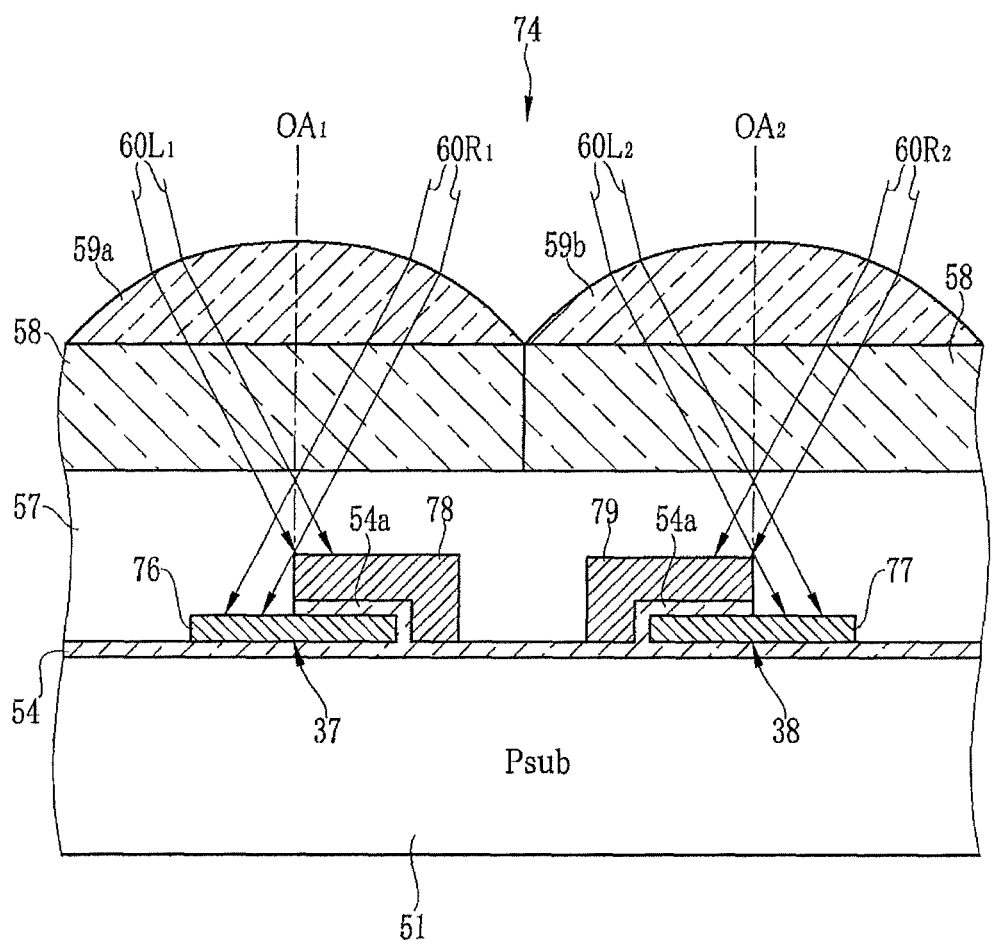
FIG. 8 is a cross-sectional view of a solid-state imaging device provided with a main photoelectric conversion film instead of a photodiode, according to a second embodiment.

Next, a solid-state imaging device 74 of a second embodiment of the present invention is described with reference to FIG. 8. In the above-described first embodiment, the first and the second pixels 37 and 38 have the first PD 41 and the second PD 44, respectively. The solid-state imaging device 74 uses photoelectric conversion films instead of the PDs. Note that parts which are identical to those of the solid-state imaging device 17 of the first embodiment have the same reference numerals and descriptions thereof are omitted (this applies to third to eighth embodiments).

In the first pixel 37 of the solid-state imaging device 74, a first main photoelectric conversion film 76 is formed over the insulation film 54. In the second pixel 38, a second main photoelectric conversion film 77 is formed over the insulation film 54. The first and the second main photoelectric conversion films 76 and 77 are made from the same material as that of the first and the second photoelectric conversion films 42 and 45 of the first embodiment.

A first sub-photoelectric conversion film 78 is formed over a right area of the first main photoelectric conversion film 76 through an insulation film 54a. A second sub-photoelectric conversion film 79 is formed over a left area of the second main photoelectric conversion film 77 through an insulation film 54a. Note that, the first and the second sub-photoelectric conversion films 78 and 79 are made from the same material as that of the first and the second photoelectric conversion films 42 and 45 of the first embodiment.

The incident light $60R_1$ incident on the first microlens 59a from a right oblique direction is collected onto the left area of the first main photoelectric conversion film 76. The incident light $60L_1$ incident on the first microlens 59a from a left oblique direction is collected onto the first sub-photoelectric conversion film 78. Most of the incident light $60L_1$ is photoelectrically converted by the first sub-photoelectric conversion film 78 and hardly reaches the first main photoelectric conversion film 76. Thereby the first main photoelectric conversion film 76 is highly sensitive to the incident light $60R_1$. The first sub-photoelectric conversion film 78 is highly sensitive to the incident light $60L_1$.

On the other hand, the incident light $60L_2$ incident on the second microlens 59b from a left oblique direction is collected onto the right area of the second main photoelectric conversion film 77. The incident light $60R_2$ incident on the second microlens 59b from a right oblique direction is collected onto the second sub-photoelectric conversion film 79. Most of the incident light $60R_2$ is photoelectrically converted by the second sub-photoelectric conversion film 79 and hardly reaches the second main photoelectric conversion film 77. Thereby the second main photoelectric conversion film 77 is highly sensitive to the incident light $60L_2$. The second sub-photoelectric conversion film 79 is highly sensitive to the incident light $60R_2$.

Thus, substantially the entire areas of the first and the second pixels 37 and 38 of the solid-state imaging device 74 receive light in a manner similar to those of the solid-state imaging device 17 of the first embodiment. Hence, the solid-state imaging device 74 produces effects similar to those of the solid-state imaging device 17 of the first embodiment.

Third Embodiment

Figure 9:
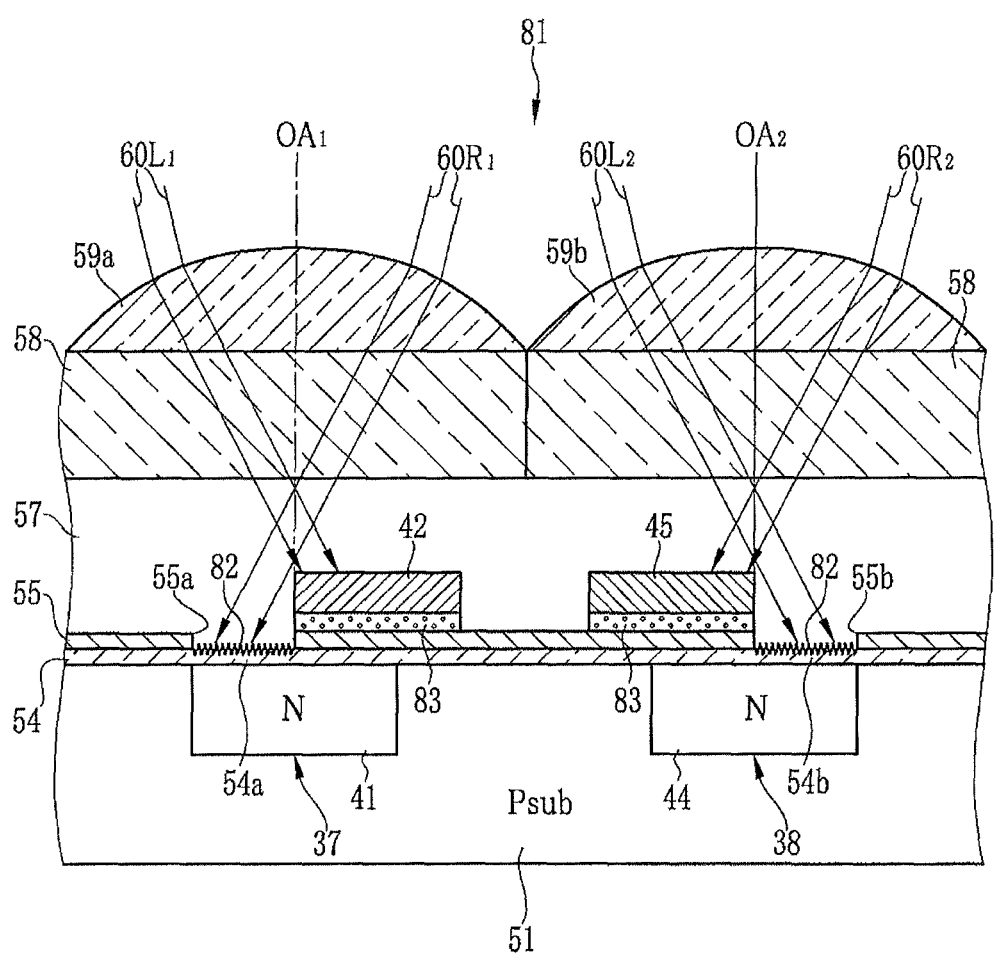
FIG. 9 is a cross-sectional view of a solid-state imaging device with micro asperities on a surface of an insulation film, according to a third embodiment.

Next, a solid-state imaging device 81 of a third embodiment is described with reference to FIG. 9. In the above-described first embodiment, the surface of the insulation film 54 (hereinafter referred to as first L insulation film 54a) above the left area (the light-receiving area) of the first PD 41 and the surface of the insulation film 54 (hereinafter referred to as second R insulation film 54b) of the right area (the light-receiving area) of the second PD 44 are planarized. In the solid-state imaging device 81 of the third embodiment, on the other hand, surfaces of the first L insulation film 54a and the second R insulation film 54b over light-receiving areas are formed into respective uneven surfaces 82. Each uneven surface 82 has micro asperities (for example, a shape with a plurality of conical projections).

A particulate foreign matter layer 83 is provided between the first photoelectric conversion film 42 and the light shield film 55 and between the second photoelectric conversion film 45 and the light shield film 55. The particulate foreign matter layer 83 contains particulate foreign matter such as $SiO_2$. The particulate foreign matter layer 83 is used for forming the uneven surface 82.

The uneven surface 82 of the first L insulation film 54a makes changes in average refractive index between the planarizing layer 57 and the first L insulation film 54a continuous. The uneven surface 82 of the second R insulation film 54b make changes in average refractive index between the planarizing layer 57 and the second R insulation film 54b continuous. Thereby the surface reflection is inhibited and thus the sensitivities of the first and the second pixels 37 and 38 improve. In particular, the conical projections reflect the incident light to the first PD 41 or the second PD 44, so that the reflection light is effectively used.

Figure 10:
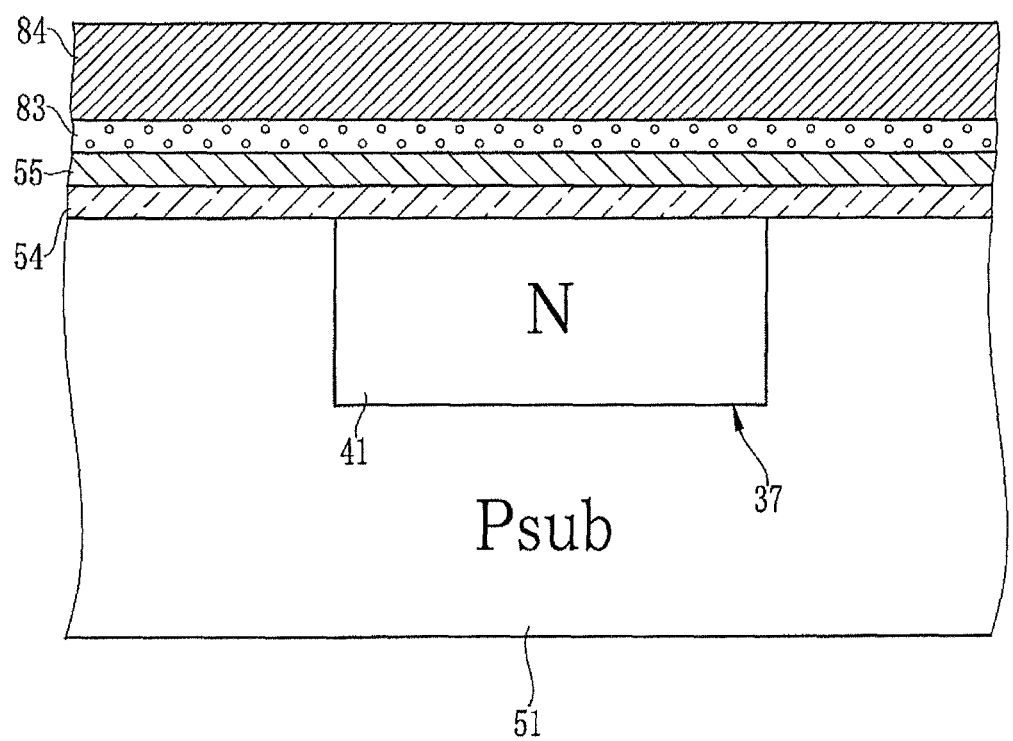
FIG. 10 is an explanatory view illustrating steps for stacking a particulate foreign matter layer and a photoelectric conversion film according to a third embodiment.

Next, a method for forming the uneven surface 82 is described with reference to FIGS. 10 to 12. Hereinafter, descriptions concerning the first pixel 37 are presented. Similar descriptions apply to the second pixel 38. First, as shown in FIG. 10, the light shield film 55, the particulate foreign matter layer 83, and a photoelectric conversion film 84 are stacked in this order from the bottom, over the insulation film 54 formed above the semiconductor substrate 51.

Figure 11:
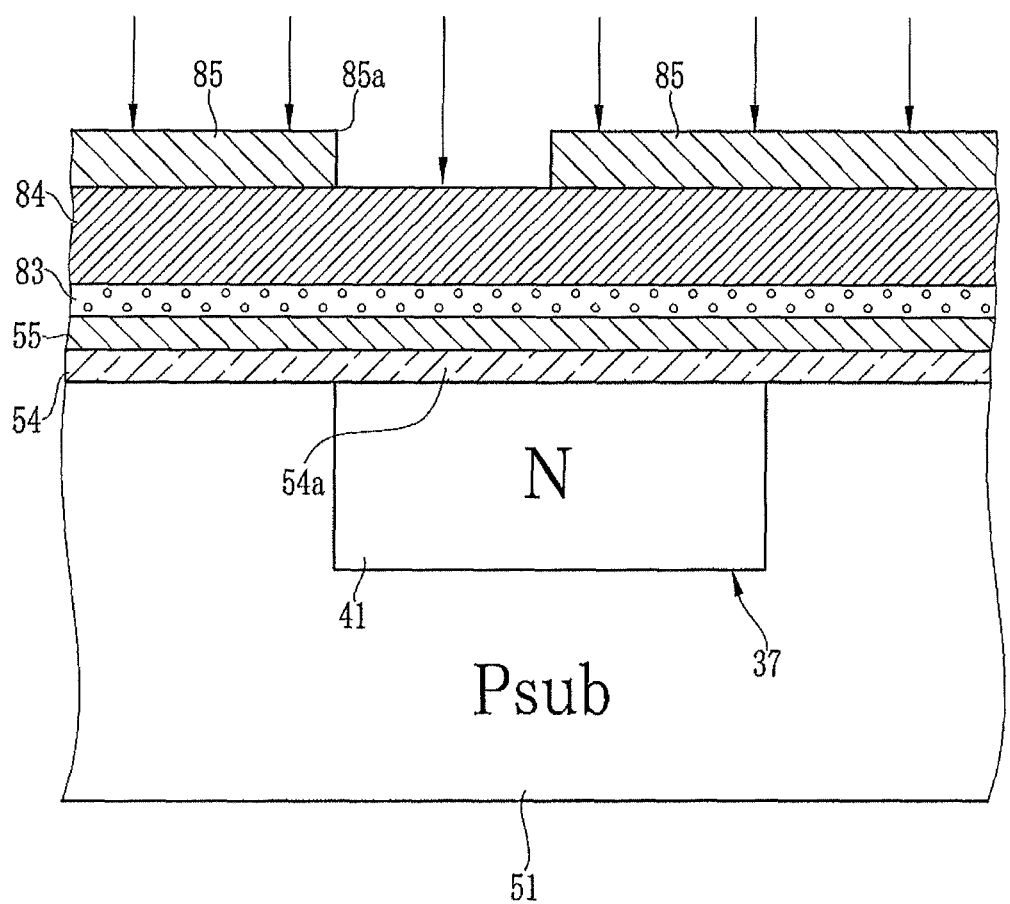
FIG. 11 is an explanatory view illustrating an etching process for the particulate foreign matter layer and the photoelectric conversion film.
Figure 12:
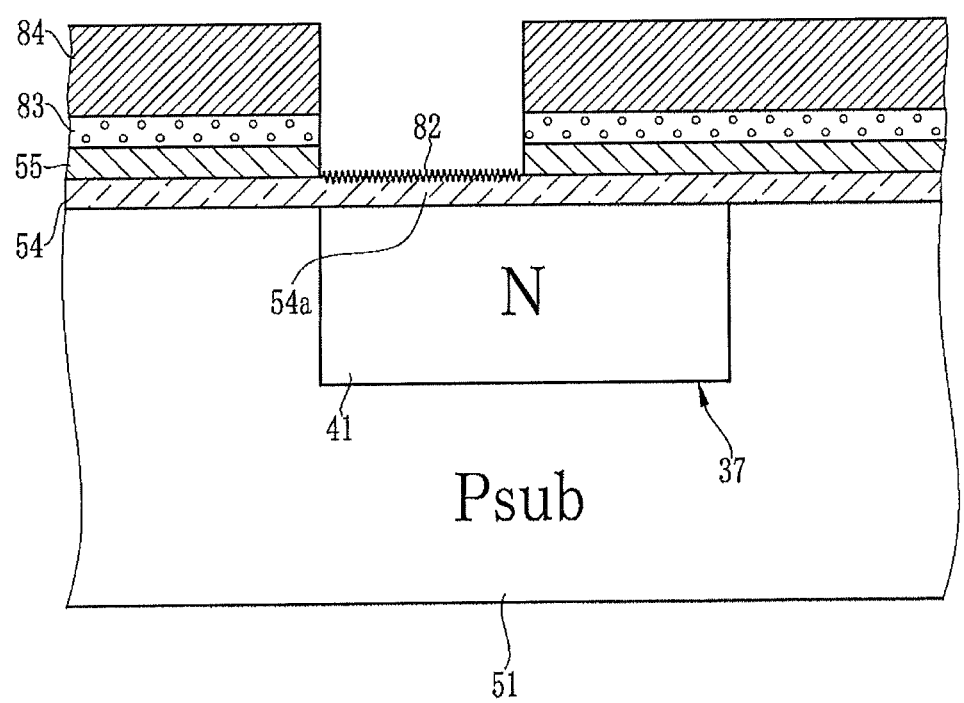
FIG. 12 is an explanatory view illustrating a state of a surface of an insulation film after the etching process.

Next, as shown in FIG. 11, a resist layer 85 is formed over the photoelectric conversion film 84. An opening 85a is formed through the resist layer 85, in a position immediately above the first L insulation film 54a. An etching process is performed on each layer above the semiconductor substrate 51, with the resist layer 85 used as a mask. Thereby the photoelectric conversion film 84 above the first L insulation film 54a is removed. Then the particulate foreign matter layer 83 is etched. In the particulate foreign matter layer 83, the etching rate of the particulate foreign matter differs from that of a remaining portion, so that the surface of the particulate foreign matter layer 83 has micro asperities during the etching.

When the particulate foreign matter layer 83 above the first L insulation film 54a is removed, the shape of the micro surface asperities of the particulate foreign matter layer 83 is transferred to the surface of the light shield film 55 above the first L insulation film 54a. Then the light shield film 55 above the first L insulation film 54a is removed and the shape of the micro surface asperities of the light shield film 55 is transferred to the surface of the first L insulation film 54a. Thereby, as shown in FIG. 12, the uneven surface 82 is formed on the surface of the first L insulation film 54a. Thus the etching process is completed.

Thereafter, the formation of the uneven surface 82 is completed by removing the resist layer 85 from above the photoelectric conversion film 84. Further, unnecessary portions are removed from the photoelectric conversion film 84 by the etching process or the like. Thus, the first and the second photoelectric conversion films 42 and 45 are formed.

Fourth Embodiment

Figure 13:
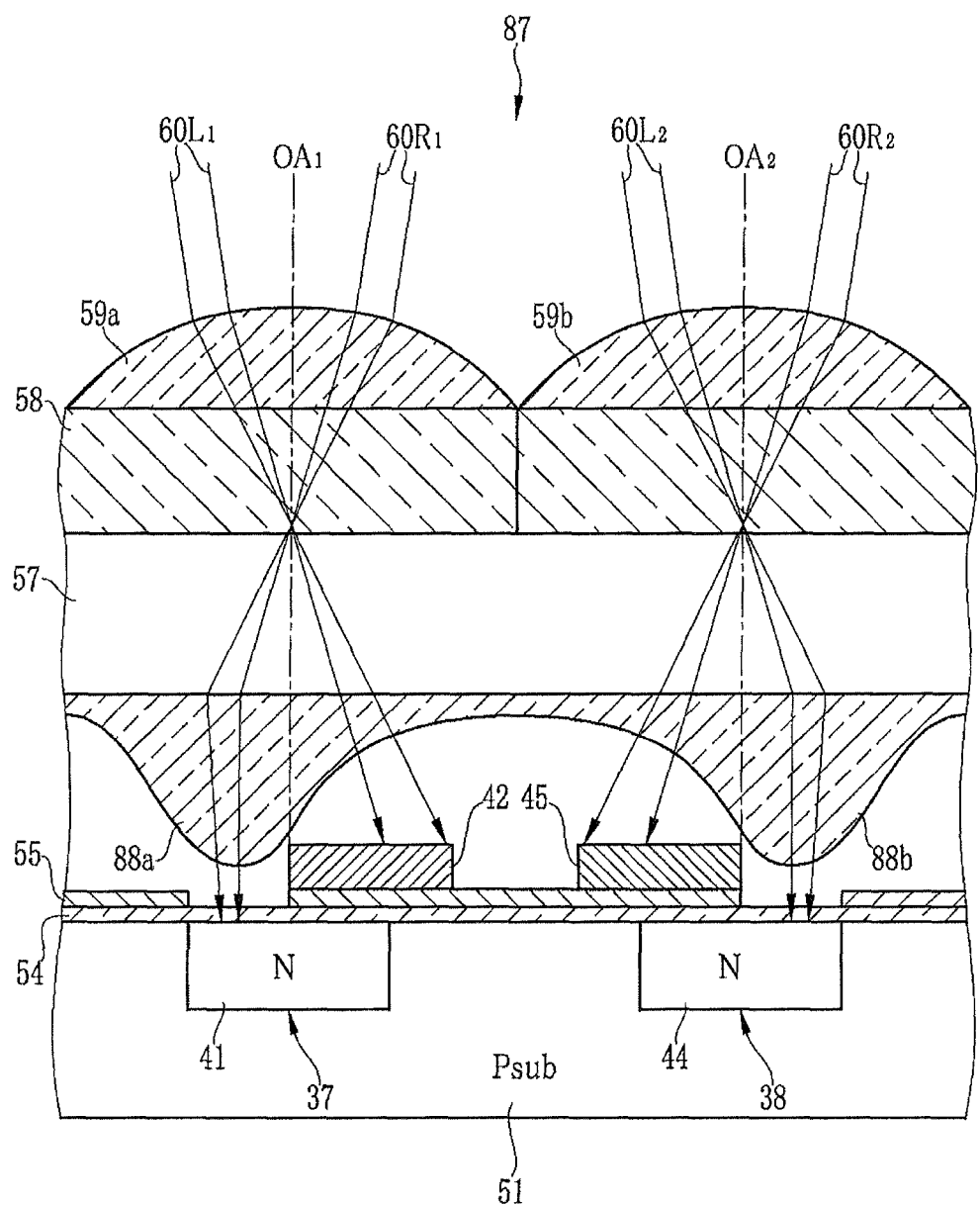
FIG. 13 is a cross-sectional view of a solid-state imaging device with an inner lens, according to a fourth embodiment.

Next, a solid-state imaging device 87 of a fourth embodiment of the present invention illustrated in FIG. 13 is described. In the above-described first embodiment, the first microlens 59a collects the incident light onto the first PD 41 and the first photoelectric conversion film 42. The second microlens 59b collects the incident light onto the second PD 44 and the second photoelectric conversion film 45. In this case, vignetting may occur in a normal image or a parallax image.

The solid-state imaging device 87 has a first inner lens 88a between the first microlens 59a, and the first PD 41 and the first photoelectric conversion film 42. The solid-state imaging device 87 has a second inner lens 88b between the second microlens 59b, and the second PD 44 and the second photoelectric conversion film 45.

An apex of the thickest part of the first inner lens 88a is located above the center of the left area (the light-receiving area) of the first PD 41. The first inner lens 88a has a downwardly convex shape whose thickness decreases as it becomes away from its center. The apex of the thickest part of the second inner lens 88b is located above the center of the right area (the light-receiving area) of the second PD 44. The second inner lens 88b has a downwardly convex shape whose thickness decreases as becoming away from the center. Hence, the first photoelectric conversion film 42 is located below a skirt portion of the first inner lens 88a. The second photoelectric conversion film 45 is located below a skirt portion of the second inner lens 88b.

The first inner lens 88a collects the incident light $60R_1$, incident on the first microlens 59a from a right oblique direction, onto the light-receiving area of the first PD 41. The first inner lens 88a collects the incident light $60L_1$, incident on the first microlens 59a from a left oblique direction, onto the first photoelectric conversion film 42. The second inner lens 88b collects the incident light $60L_2$, incident on the second microlens 59b from a left oblique direction, onto the light-receiving area of the second PD 44. The second inner lens 88b collects the incident light $60R_2$, incident on the second microlens 59b from a right oblique direction, onto the second photoelectric conversion film 45. Thus, the first and the second microlenses 59a and 59b allow the incident light, which is incident on the first and the second microlenses 59a and 59b, to enter the PDs and the photoelectric conversion films appropriately.

In the solid-state imaging device 87, each pixel is provided with an inner lens. Note that each pixel may be provided with two or more inner lenses. For example, in the first pixel 37, an inner lens is formed over each of the first photoelectric conversion film 42 and the light-receiving area of the first PD 41.

In the second pixel 38, an inner lens is formed over each of the second photoelectric conversion film 45 and the light-receiving area of the second PD 44.

Fifth Embodiment

Figure 14:
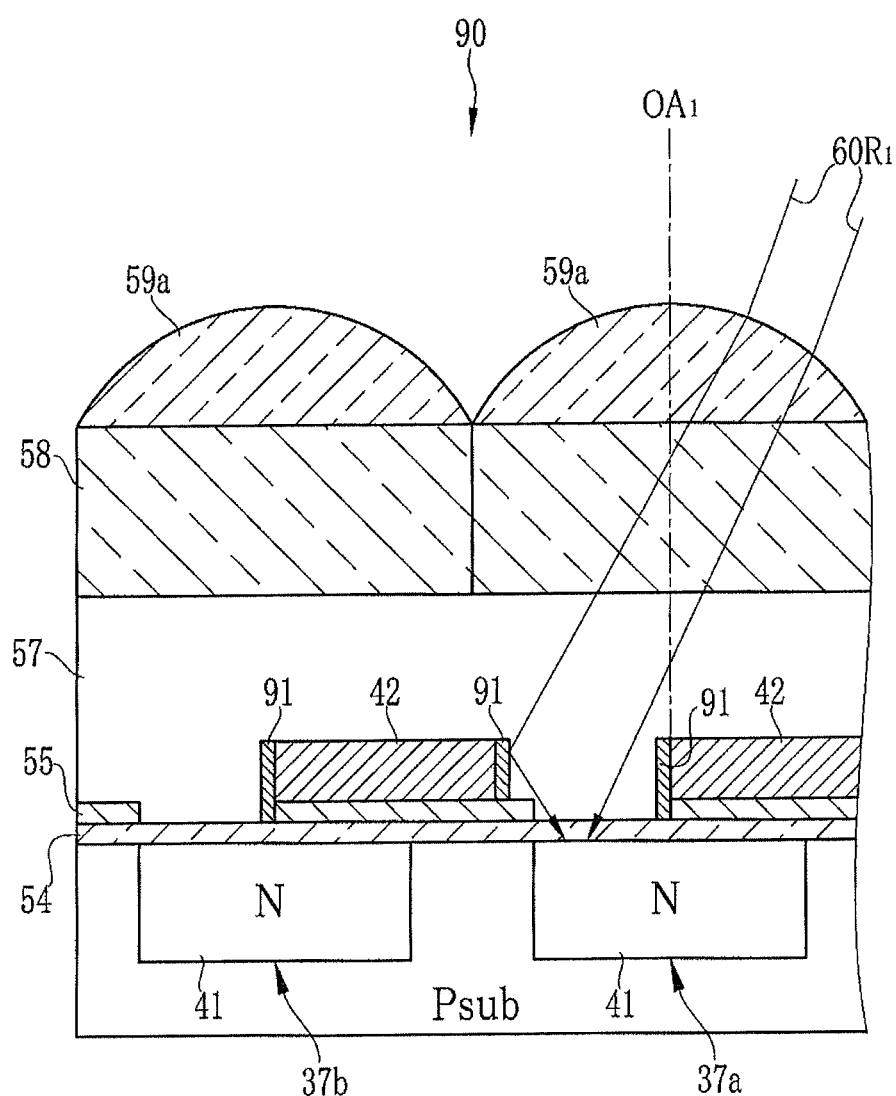
FIG. 14 is a cross-sectional view illustrating a structure of two adjacent first pixels of a solid-state imaging device according to a fifth embodiment.

Next, a solid-state imaging device 90 of a fifth embodiment of the present invention illustrated in FIG. 14 is described. In the above-described first embodiment, sides of the first and the second photoelectric conversion films 42 and 45 are exposed. On the other hand, reflection walls 91 are formed on the sides of the first and the second photoelectric conversion films 42 and 45 of the solid-state imaging device 90. The reflection wall 91 is made from a material with a high refractive index. For example, in a case where a part of the incident light $60R_1$, incident on a first pixel 37a, hits the side of the first photoelectric conversion film 42 of an adjacent first pixel 37b, the reflection wall 91 reflects the incident light $60R_1$ back to the first pixel 37a. Thereby the incident light $60R_1$ enters the first PD 41. Thus, the reflection wall 91 prevents the incident light from entering the photoelectric conversion film of an adjacent pixel.

Thereby the amounts of the incident light incident on the first PD 41 of the first pixel 37 and the second PD 44 of the second pixel 38 increase. As a result, the sensitivities of the first and the second pixels 37 and 38 improve.

Sixth Embodiment

Figure 15:
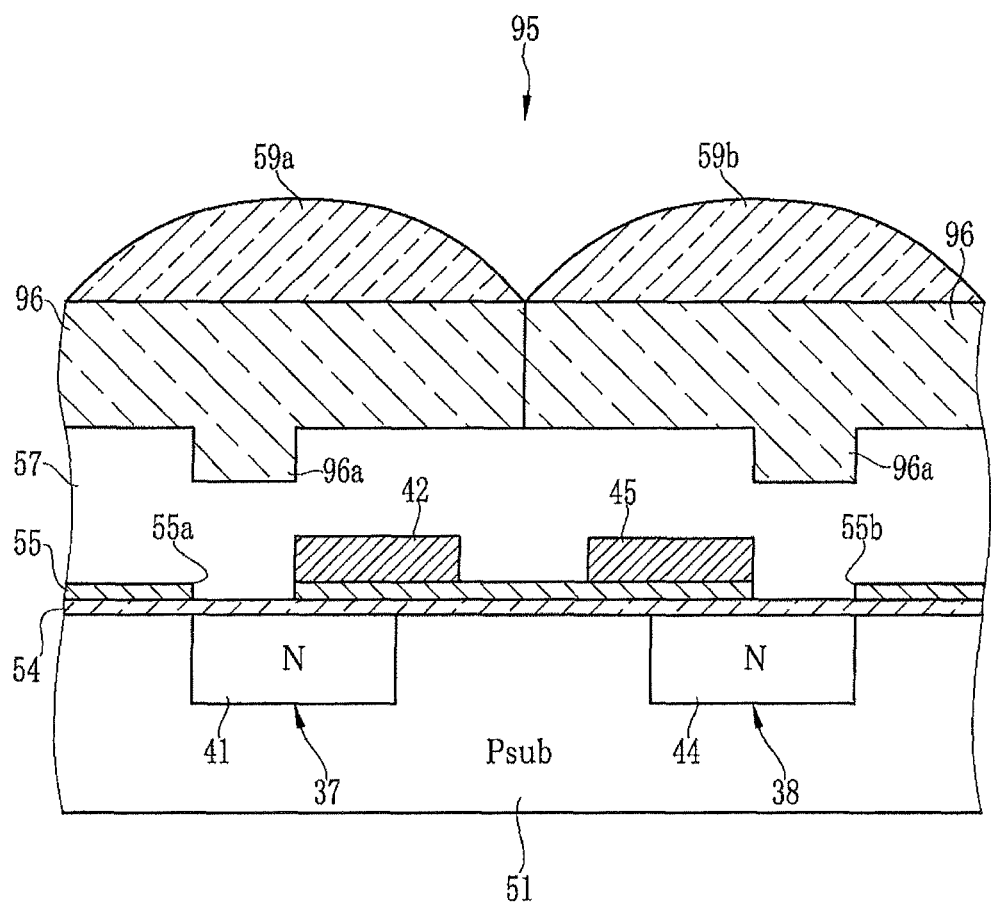
FIG. 15 is a cross-sectional view of a solid-state imaging device according to a sixth embodiment in which a color filter is partly made thick.

In a solid-state imaging device 95 of a sixth embodiment of the present invention illustrated in FIG. 15, a portion of a color filter 96 is made thicker than the remaining portion of the color filter 96. To be more specific, the color filters 96 are formed with protruding portions 96a. The protruding portion 96a is formed in each of a position immediately above the left area (the light-receiving area) of the first PD 41 and a position immediately above the right area (the light-receiving area) of the second PD 44. The protruding portion 96a protrudes downward. An amount of transmitted light is changed by changing the thickness of the protruding portion 96a. Thereby the sensitivities of the first and the second PDs 41 and 44 are adjusted.

Figure 16:
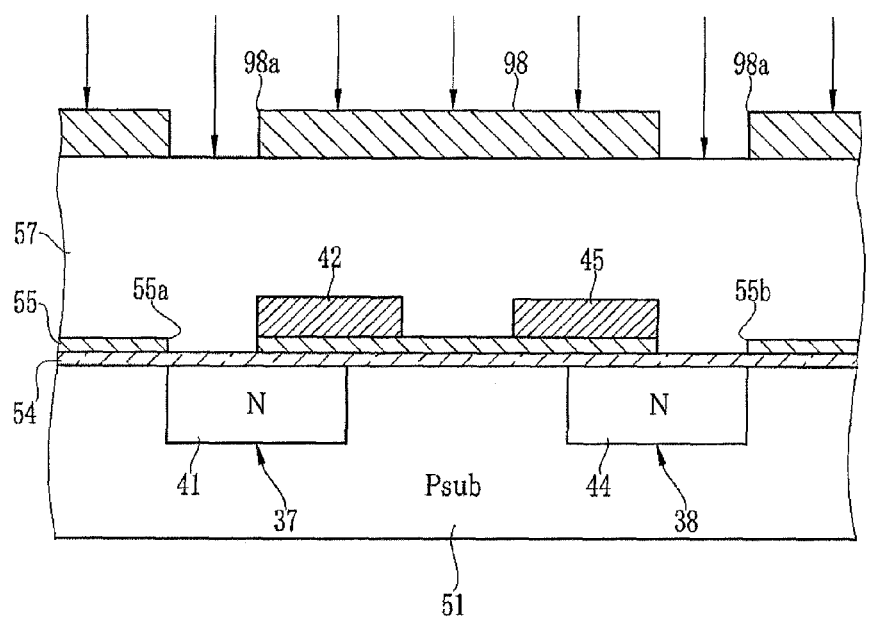
FIG. 16 is an explanatory view illustrating a resist layer forming process and an etch-back process according to the sixth embodiment.

A method for forming the color filters 96 is described with reference to FIGS. 16 and 17. As shown in FIG. 16, a resist layer 98 is formed over the planarizing layer 57 after the planarizing layer 57 is formed. Next, openings 98a are formed through the resist layer 98. The opening 98a is formed in each of a position immediately above the left area of the first PD 41 and a position immediately above the right area of the second PD 44. Then overall etching, that is, the so-called etch-back process of the resist layer 98 and the planarizing layer 57 is performed.

Figure 17:
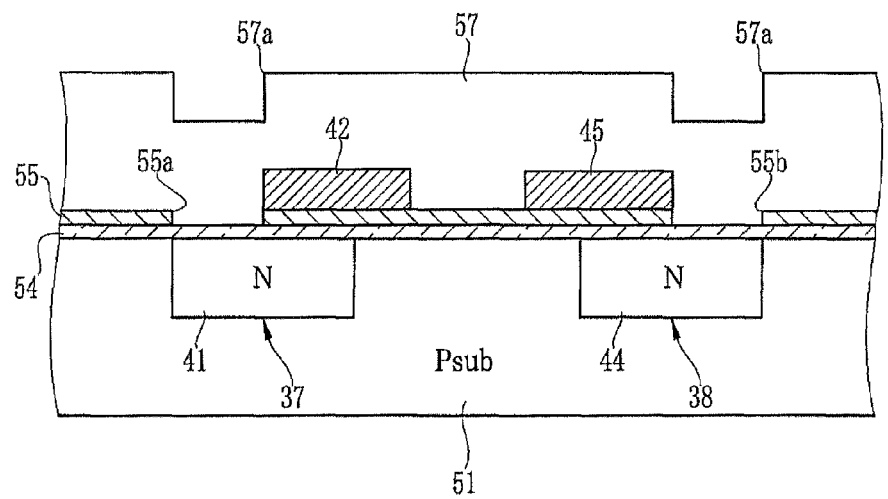
FIG. 17 is an explanatory view illustrating a surface state of a planarizing layer in the etch-back process.

As shown in FIG. 17, as a result of the etch-back process, the planarizing layer 57 is formed with depressed portions 57a. The depressed portion 57a is formed in each of a position immediately above the left area of the first PD 41 and a position immediately above the right area of the second PD 44. Then a color filter material is applied over the planarizing layer 57. Thereby the color filter material fills the depressed portion 57a. The color filter material is hardened. Thus the color filters 96 having the protruding portions 96a are formed.

Seventh Embodiment

Figure 18:
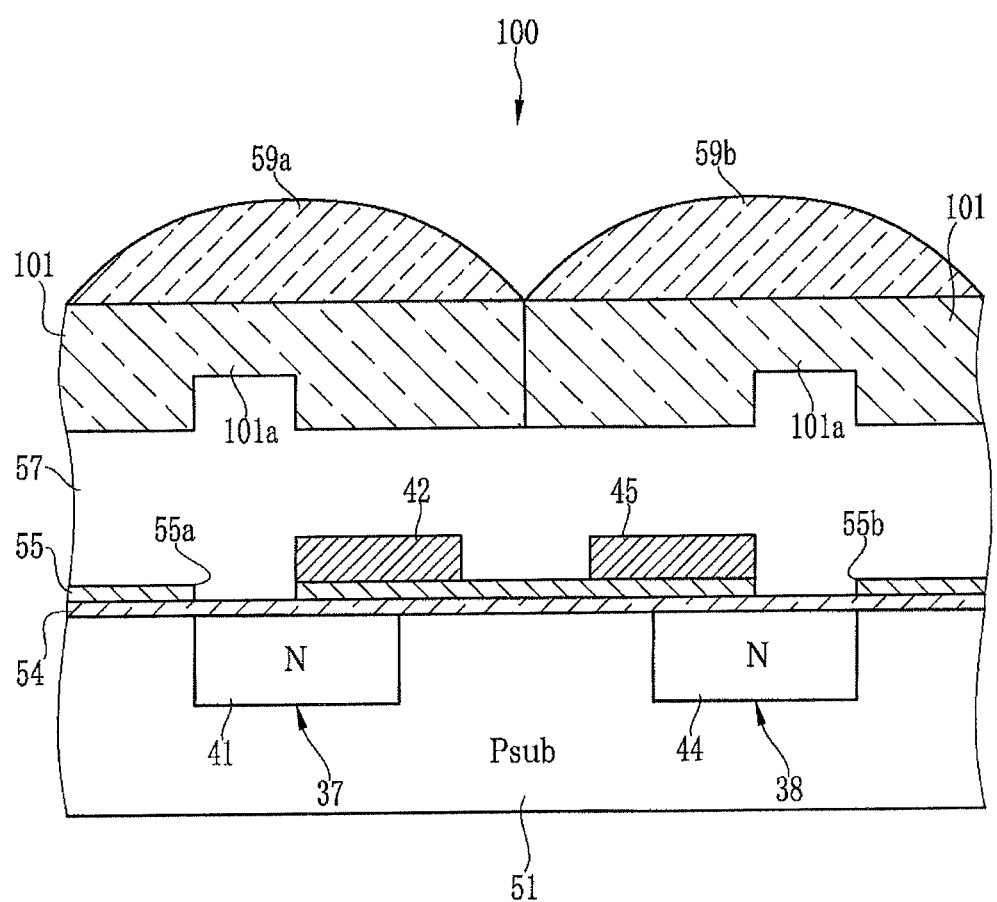
FIG. 18 is a cross-sectional view of a solid-state imaging device according to a seventh embodiment in which a color filter is made partly thin.

In a solid-state imaging device 100 of a seventh embodiment of the present invention illustrated in FIG. 18, a portion of a color filter 101 is made thinner than the remaining portion of the color filter 101. To be more specific, the color filter 101 is formed with thin portions 101a, each in a position immediately above the left area of the first PD 41 and a position immediately above the right area of the second PD 44. The thickness of the thin portion 101a is smaller than that of the remaining portion. The thickness of the thin portion 101a is changed to adjust the sensitivities of the first and the second PDs 41 and 44, in a manner similar to the sixth embodiment.

Figure 19:
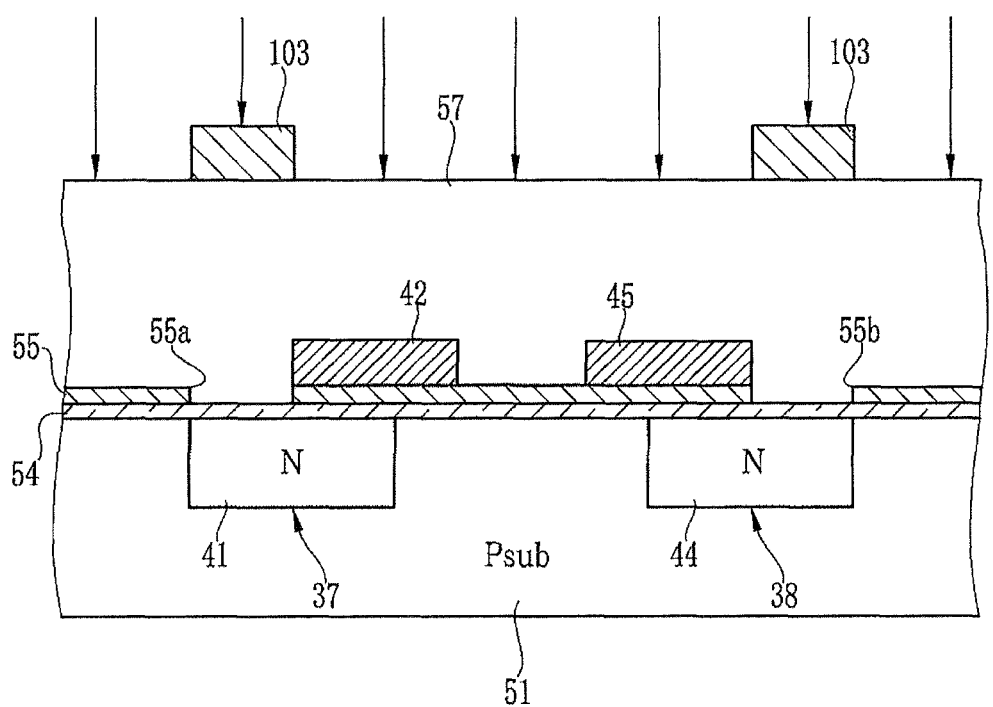
FIG. 19 is an explanatory view illustrating a resist layer forming process and an etch-back process according to the seventh embodiment.

A method for forming the color filters 101 is described. As shown in FIG. 19, resist layers 103 are formed over the planarizing layer 57. The resist layers 103 cover a position immediately above the left area of the first PD 41 and a position immediately above the right area of the second PD 44, only and respectively.

Figure 20:
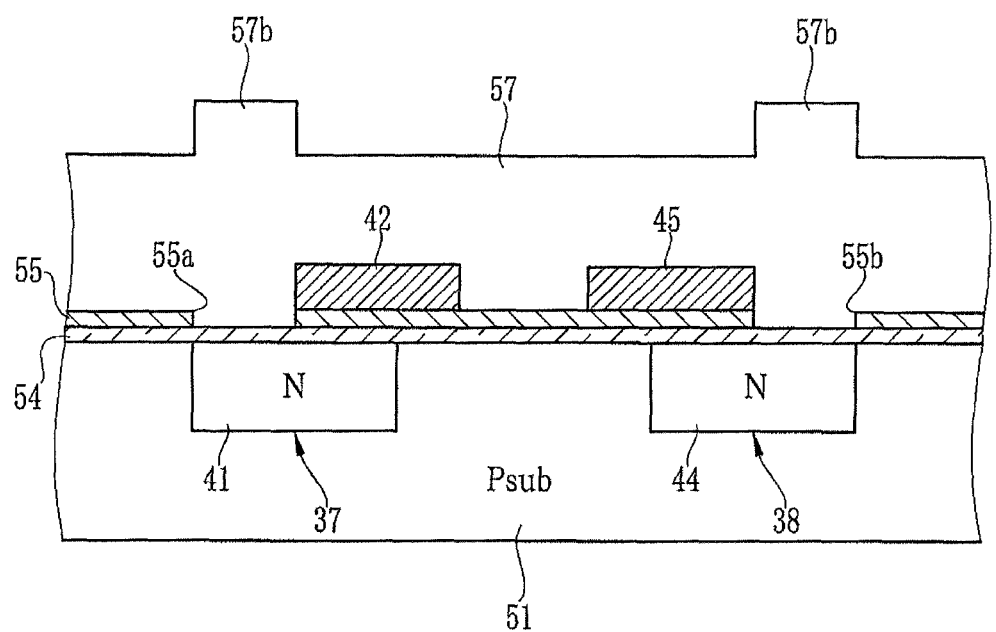
FIG. 20 is an explanatory view illustrating a surface state of the planarizing layer in the etch-back process.

Next, the etch-back process is performed in a manner similar to the sixth embodiment. Thereby, as shown in FIG. 20, the planarizing layer 57 is formed with projected portions 57b, each in a position immediately above the left area of the first PD 41 and a position immediately above the right area of the second PD 44. A color filter material is applied over the planarizing layer 57 and hardened. Thereby the color filters 96 having the thin portions 101a are formed.

Note that, in the sixth and seventh embodiments, the colors (for example, red, green, or blue) of the portions of the color filters located immediately above the left area of the first PD 41 and the right area of the second PD 44 may differ from those of the remaining portions of the color filters. A single pixel may be provided with two color filters of complementary colors. The color filters may be omitted to obtain luminance information only.

Eighth Embodiment

Figure 21:
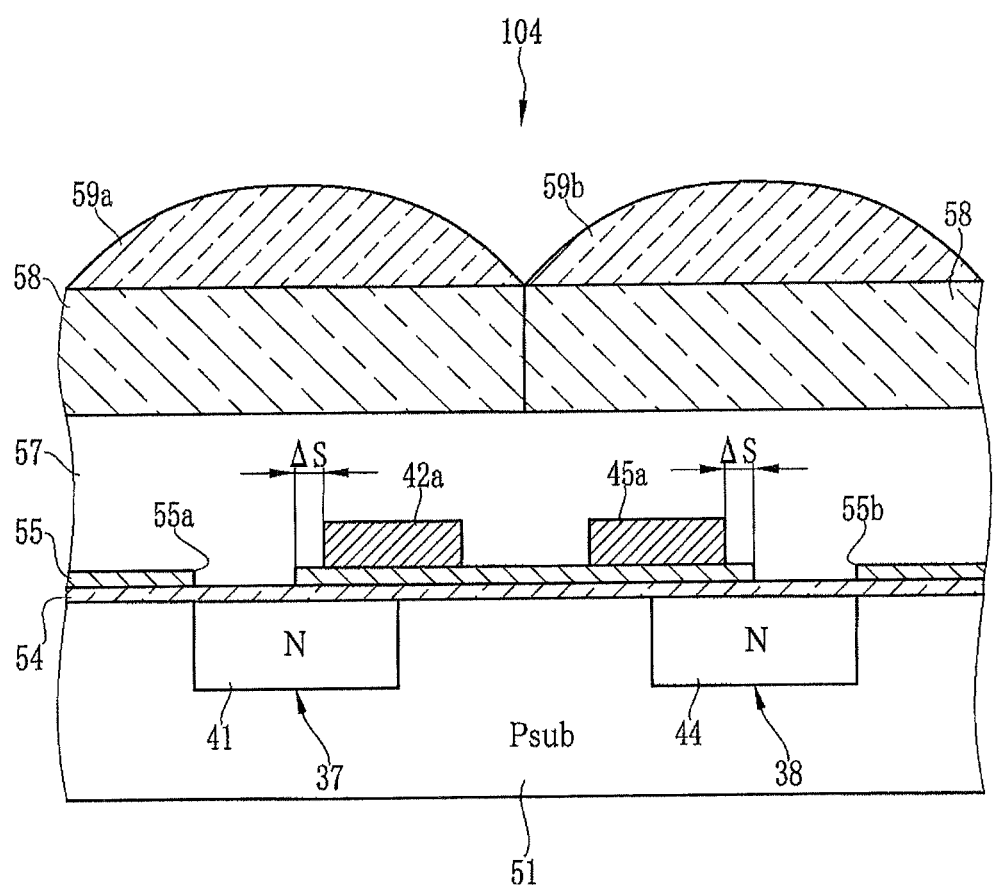
FIG. 21 is a cross-sectional view of a solid-state imaging device according to an eighth embodiment in which an area of a photoelectric conversion film is reduced.

Next, in a solid-state imaging device 104 of a seventh embodiment of the present invention illustrated in FIG. 21, an area of each of first and second photoelectric conversion films 42a and 45a is reduced by ΔS as compared with that in the first embodiment. Thereby the sensitivities of the first and the second photoelectric conversion films 42a and 45a are reduced.

Figure 22:
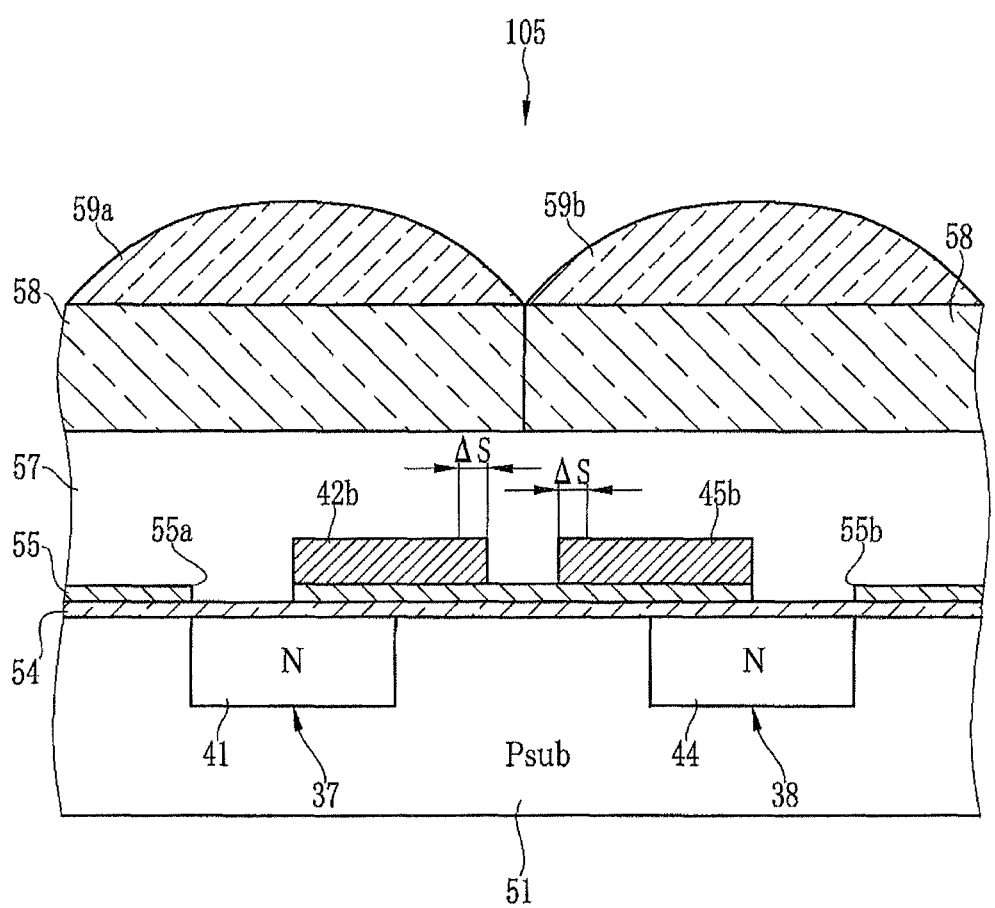
FIG. 22 is a cross-sectional view of a solid-state imaging device in which an area of a photoelectric conversion film is increased.

On the other hand, in a solid-state imaging device 105 shown in FIG. 22, an area of each of the first and the second photoelectric conversion films 42b and 45b is increased by ΔS as compared with that in the first embodiment. Thereby the sensitivities of the first and the second photoelectric conversion films 42b and 45b are increased.

As described above, the areas of the first and the second photoelectric conversion films are changed to adjust the sensitivities of the first and the second photoelectric conversion films. The areas of the PD and the photoelectric conversion film are appropriately adjusted to cancel the difference between the sensitivities of the PD and the photoelectric conversion film.

Most of the light incident on the first and the second photoelectric conversion films 42 and 45 is photoelectrically converted and hardly reaches the first and the second PDs 41 and 44. Hence, the light shield film 55 below the first and the second photoelectric conversion films 42 and 45 may be omitted.

In each of the above embodiments, the solid-state imaging device comprises the first and the second pixels only. The solid-state imaging device is capable of capturing a stereoscopic image in addition to a normal image. In a case where only a normal image is captured, the first and the second pixels are used for the AF control of the phase detection method. In this case, the first and the second pixels are disposed in a distance-measuring area, for example, a center portion of a screen. Third pixels (normal pixels) are disposed in an area surrounding the center portion of the screen. Each third pixel is formed with a photoelectric converter only. In a case where the whole screen is the distance-measuring area, pairs of the first and the second pixels are dispersed to appropriate positions within the screen and the third pixels are disposed in the remaining areas of the screen.

In the above embodiments, the first pixel rows 39a and the second pixel rows 39b are arranged alternately in the solid-state imaging device 17 of the first embodiment. Arrangement patterns of the first and the second pixels are not limited to this.

In the above embodiments, the solid-state imaging device, the first and the second signal adjustment circuits 33 and 34, and the signal adder circuit 35 are formed over the same semiconductor substrate. Alternatively, the solid-state imaging device, the first and the second signal adjustment circuits 33 and 34, and the signal adder circuit 35 may be provided separately.

The display section 30, such as a liquid crystal display, capable of displaying a two-dimensional image or a three-dimensional image may be used. A lenticular method, a parallax barrier method, a parallax barrier method, an anaglyphic method, a frame sequential method, a light direction method or the like is used to display the three-dimensional image.

The photoelectric conversion film is overlapped over the photoelectric converter (for example, a photodiode). The photoelectric conversion film and the photoelectric converter may be disposed side by side. The present invention is also applicable to a CCD-type solid-state imaging device in addition to a CMOS-type solid-state imaging device.

The first and the second pixels adjacent to each other are used as a pair. The signal charges are read out on a pair basis. Then the intrapixel addition or the interpixel addition is performed. Alternatively, the signal charge may be read out on a pixel basis. The charges stored in the adjacent first and the second pixels of the same pair are readout successively, and then the adding process may be performed. Instead, the signal is read out on a pixel basis and the pixel signal from the photoelectric converter and the pixel signal from the photoelectric conversion film are subjected to image processing. Thereafter the pixel signals are written into two types of frame memories. Then, each pixel signal is read out and a calculation section may perform the adding process on a pair basis.

Various changes and modifications are possible in the present invention and may be understood to be within the present invention.

What is claimed is:

1. A solid-state imaging device comprising:
a plurality of first pixels each having a first photoelectric converter and a first photoelectric conversion film, the first photoelectric converter and the first photoelectric conversion film photoelectrically converting incident light, the first photoelectric conversion film being shifted in a first direction relative to the first photoelectric converter; and
a plurality of second pixels each having a second photoelectric converter and a second photoelectric conversion film, the second photoelectric converter and the second photoelectric conversion film photoelectrically converting incident light, the second photoelectric conversion film being shifted in a second direction relative to the second photoelectric converter, the second direction being opposite to the first direction;
wherein the first photoelectric conversion film partially covers an incident side of the first photoelectric converter and the second photoelectric conversion film partially covers an incident side of the second photoelectric converter, and the first photoelectric converter is located at the center of the first pixel and the second photoelectric converter is located at the center of the second pixel.

2. The solid-state imaging device of claim 1, further comprising:
a first adder circuit for adding a signal of the photoelectric converter and a signal of the photoelectric conversion film in each of the first and the second pixels; and
a second adder circuit for adding the signal of the first photoelectric converter and the signal of the second photoelectric conversion film of the two adjacent first and second pixels and for adding the signal of the second photoelectric converter and the signal of the first photoelectric conversion film of the two adjacent first and second pixels.

3. The solid-state imaging device of claim 1, wherein each of the first and the second photoelectric converters is a photodiode formed in a surface layer of a semiconductor substrate, and the first photoelectric converter has a portion, not covered by the first photoelectric conversion film, as a light-receiving area, and the second photoelectric converter has a portion, not covered by the second photoelectric conversion film, as a light-receiving area.

4. The solid-state imaging device of claim 1, wherein each of the first and the second photoelectric converters is a photoelectric conversion film formed over a semiconductor substrate, and the first photoelectric converter has a portion, not covered by the first photoelectric conversion film, as a light-receiving area, and the second photoelectric converter has a portion, not covered by the second photoelectric conversion film, as a light-receiving area.

5. The solid-state imaging device of claim 3, wherein a light-transmissive insulation film is formed over the semiconductor substrate, and the first and the second photoelectric conversion films are formed over the insulation film.

6. The solid-state imaging device of claim 5, wherein micro asperities are formed on a surface of the insulation film located above the light-receiving area.

7. The solid-state imaging device of claim 5, wherein each of the first and the second pixels comprises a microlens and an inner lens located on an inner side of the microlens, and an optical axis of the microlens is coincident with a center of the corresponding pixel, and an apex of the inner lens is coincident with a center of the corresponding light-receiving area.

8. The solid-state imaging device of claim 3, wherein a reflection wall is formed on a side of each of the first and the second photoelectric conversion films, and the reflection wall is made from a material with a high refractive index.

9. The solid-state imaging device of claim 3, wherein the first and the second pixels have color filters, and thickness of a portion of the color filter located above the light-receiving area differs from thickness of a portion of the color filter located above the first photoelectric conversion film and thickness of a portion of the color filter located above the second photoelectric conversion film.

10. The solid-state imaging device of claim 3, wherein an area of the light-receiving area differs from an area of the first photoelectric conversion film and an area of the second photoelectric conversion film.

11. A digital camera having a taking lens for forming an image of a subject and a solid-state imaging device for capturing the image, the solid-state imaging device comprising:
a plurality of first pixels each having a first photoelectric converter and a first photoelectric conversion film, the first photoelectric converter and the first photoelectric conversion film photoelectrically converting incident light, the first photoelectric conversion film being shifted in a first direction relative to the first photoelectric converter; and
a plurality of second pixels each having a second photoelectric converter and a second photoelectric conversion film, the second photoelectric converter and the second photoelectric conversion film photoelectrically converting incident light, the second photoelectric conversion film being shifted in a second direction relative to the second photoelectric converter, the second direction being opposite to the first direction;
wherein the first photoelectric conversion film partially covers an incident side of the first photoelectric converter and the second photoelectric conversion film partially covers an incident side of the second photoelectric converter, and the first photoelectric converter is located at the center of the first pixel and the second photoelectric converter is located at the center of the second pixel.

* * * * *